(12) United States Patent
Miura

(10) Patent No.: US 6,885,851 B1
(45) Date of Patent: Apr. 26, 2005

(54) AUTOMATIC GAIN CONTROL CIRCUIT AND RECEIVER DEVICE HAVING THE AUTOMATIC GAIN CONTROL CIRCUIT, AND AUTOMATIC GAIN CONTROL METHOD

(75) Inventor: Nozomi Miura, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/527,924

(22) Filed: Mar. 17, 2000

(30) Foreign Application Priority Data

Mar. 18, 1999 (JP) ............................................ 11-073977

(51) Int. Cl.$^7$ ................................................. H04B 1/06
(52) U.S. Cl. ............................... 455/234.1; 455/235.1; 455/245.1; 455/250.1
(58) Field of Search .......................... 455/232.1, 233.1, 455/234.1, 234.2, 235.1, 239.1, 240.1, 241.1, 242.1, 244.1, 245.1, 250.1, 226.1, 226.2; 330/280, 281

(56) References Cited

U.S. PATENT DOCUMENTS

| 4,292,598 A | | 9/1981 | Yasumura |
| 4,574,202 A | | 3/1986 | Ogawa |
| 4,827,511 A | * | 5/1989 | Masuko ........................ 330/281 |
| 5,204,976 A | * | 4/1993 | Baldwin et al. .......... 455/234.2 |
| 5,337,201 A | | 8/1994 | Oyama |
| 5,408,698 A | * | 4/1995 | Serizawa et al. ......... 455/245.1 |
| 5,603,113 A | * | 2/1997 | De Loe, Jr. ............... 455/234.1 |
| 5,613,230 A | * | 3/1997 | Gottfried et al. ......... 455/234.1 |
| 5,724,652 A | * | 3/1998 | Graham et al. ........... 455/234.1 |
| 5,835,846 A | * | 11/1998 | Furukawa et al. ........ 455/226.2 |
| 6,049,715 A | * | 4/2000 | Willhoff et al. .......... 455/226.2 |
| 6,295,445 B1 | * | 9/2001 | Uesugi ...................... 455/234.1 |

FOREIGN PATENT DOCUMENTS

| EP | 0 785 632 | 7/1997 |
| EP | 0 812 064 | 12/1997 |
| EP | 0 856 942 | 8/1998 |
| FR | 2 712 751 | 5/1995 |
| JP | 3-53707 | 3/1991 |
| JP | 6-53765 | 2/1994 |
| JP | 6-152286 | 5/1994 |
| JP | 8-51329 | 2/1996 |
| JP | 9-266422 | 10/1997 |
| JP | 10-336142 | 12/1998 |

* cited by examiner

Primary Examiner—Quochien B. Vuong
(74) Attorney, Agent, or Firm—Pearne & Gordon LLP

(57) ABSTRACT

An automatic gain control circuit optimizes a follow-up performance of an automatic gain control loop to thus assure a good receiving operation. A generation timing or a generation period of a control signal GC is decided in response to a lapsed time in operation of the receiver device. For a predetermined rise period from a non-operated state to the steady operation state when a power supply is shifted from its OFF state to its ON state (power supply is turned ON) or at the time of intermittent receiving operation, the generation period of the control signal GC is set shorter than the generation period in a steady operation state so as to accelerate the response characteristic of the automatic gain control gain rather than the steady operation condition, and then switched to the generation period in the steady operation state after a predetermined time.

4 Claims, 13 Drawing Sheets

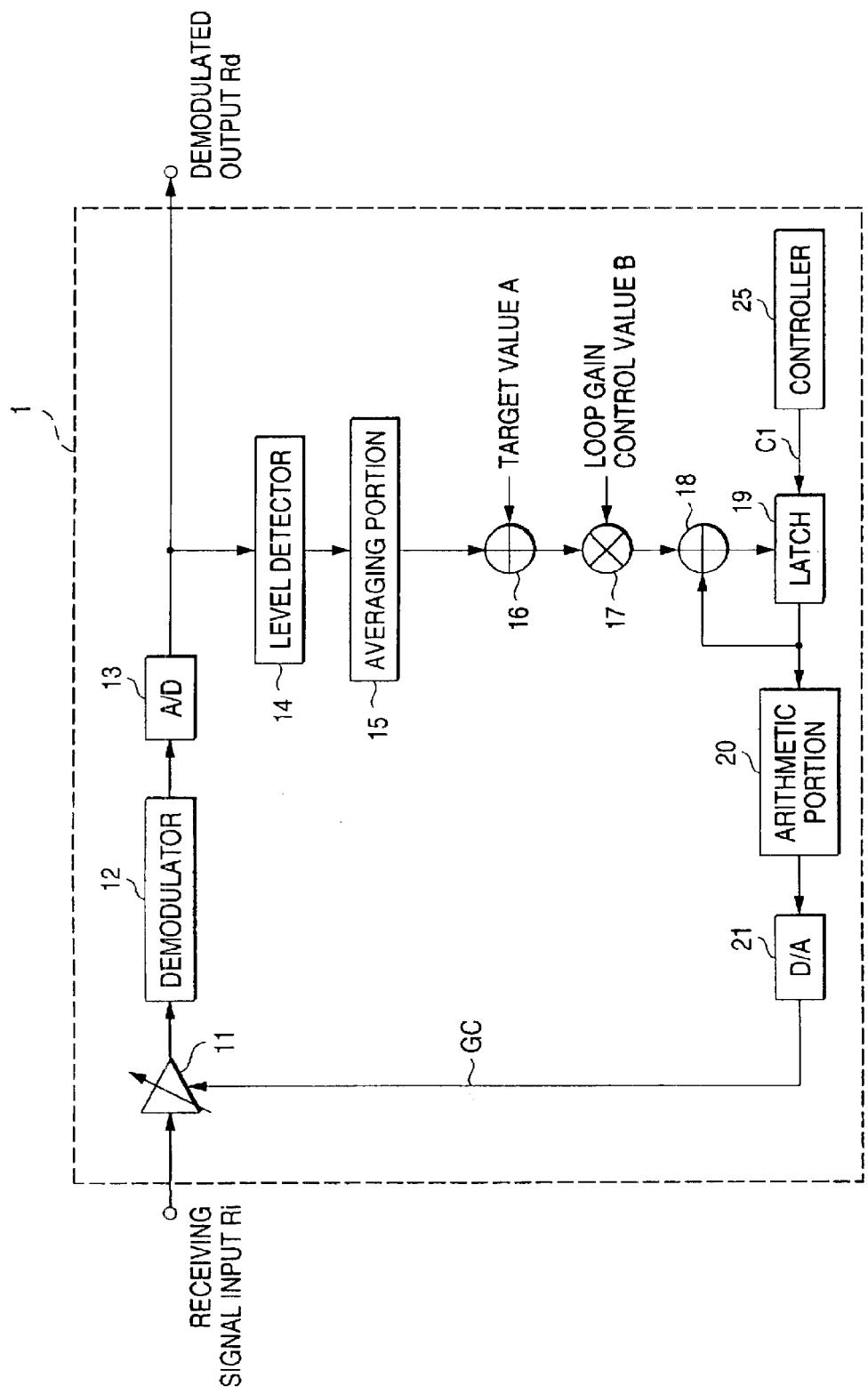

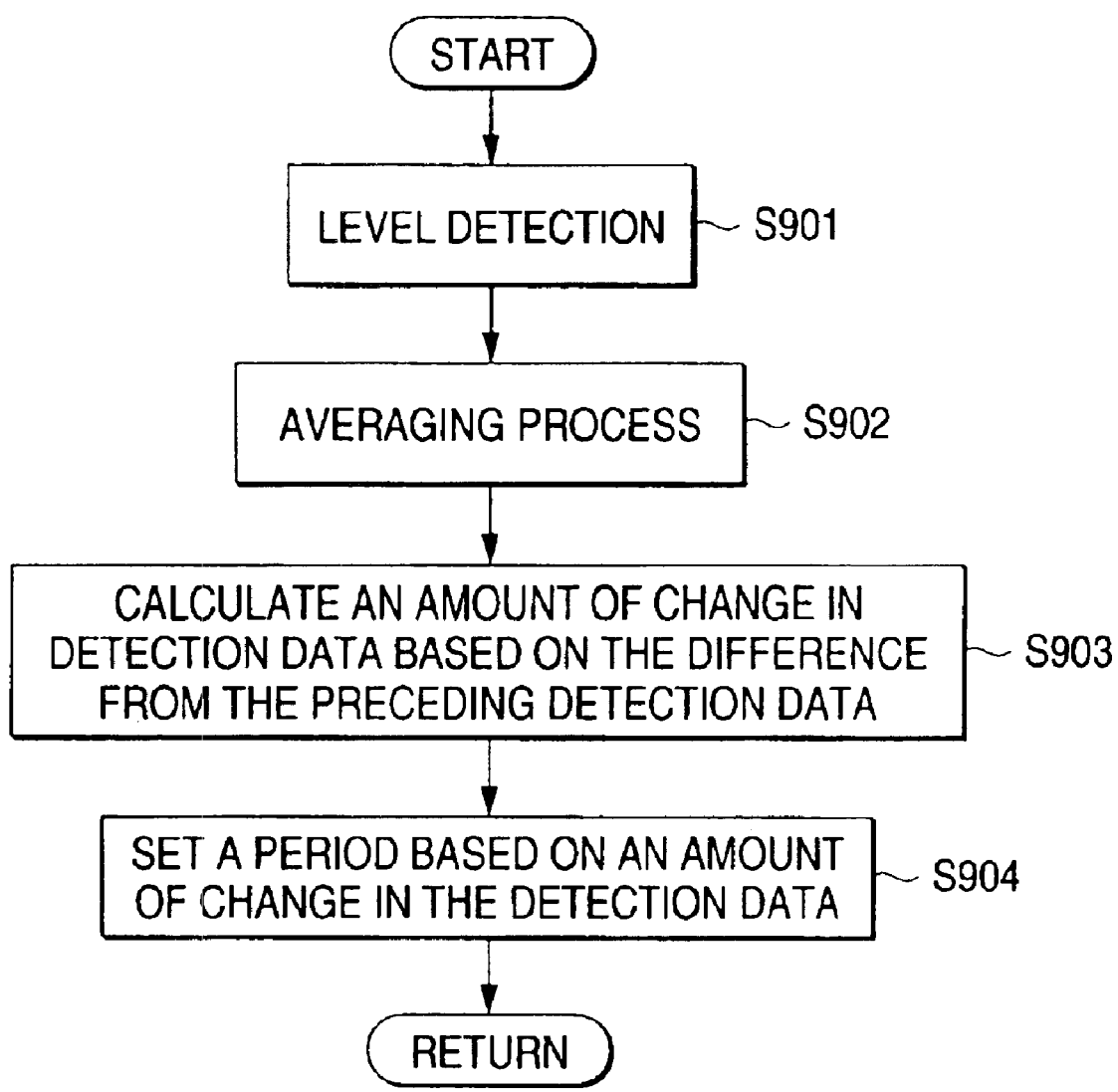

AUTOMATIC GAIN CONTROL CIRCUIT AND RECEIVER DEVICE HAVING THE AUTOMATIC GAIN CONTROL CIRCUIT, AND AUTOMATIC GAIN CONTROL METHOD

BACKGROUND OF THE INVENTION

The present invention relates to an automatic gain control circuit which is able to assure a good receiving operation by optimizing a follow-up performance of an automatic gain control loop, a receiver device with the automatic gain control circuit, an automatic gain control method in the receiver device, and a recording medium for recording a program for carrying out the automatic gain control method.

As the automatic gain control circuit in the receiver device in the prior art, the circuit as shown in FIG. 13 has been well known, for example. In FIG. 13, the automatic gain control circuit in the prior art is constructed to comprises a gain variable amplifier 11, a demodulator portion 12, an A/D converter 13, a level detector 14, an averaging portion 15, an adder 16 for calculating a difference-in-converged value, a multiplier 17 for controlling a loop gain, an adder 18 in an integrator circuit portion, a latch circuit 19 in an integrator circuit portion, an arithmetic portion 20, and a D/A converter 21.

In the automatic gain control circuit in the prior art, when a receiving signal Ri is input, such receiving signal input Ri is amplified by the gain variable amplifier 11, then demodulated by the demodulator portion 12, and then converted into a digital value by the A/D converter 13 to be output as a demodulated output Rd. A part of the demodulated output Rd is level-detected by the level detector 14 and then send out to an automatic gain control loop.

The level-detected data are averaged for a predetermined time by the averaging portion 15. Then, a difference between an output of the averaging portion 15 and a constant target level A is calculated by the difference-in-converged value calculating adder 16 so as to converge the output to the input for the A/D converter 13, and then multiplied by a loop gain control value B in the automatic gain control circuit by the loop gain controlling multiplier 17. An output of the multiplier 17 is input into an integrator circuit portion, which consists of the adder 18 and the latch circuit 19, as an amount of change from the preceding data, and then integral data are latched by the latch circuit 19 at a timing of a latch timing control value C4. The integral data from the integrator circuit portion are converted into data equivalent to the control voltage for the gain variable amplifier 11 by the arithmetic portion 20, then converted into an analogue voltage by the D/A converter 21, and then fed back to the gain variable amplifier 11 as the control voltage.

However, in the above automatic gain control circuit in the prior art, a generation or update period of the control signal which is fed back to the gain variable amplifier 11 is fixed. For this reason, when variation in level of the receiving signal Ri is largely caused at the time of a turn-ON operation of a power supply of the automatic gain control circuit, an intermittent receiving operation of the receiver device which includes the automatic gain control circuit, a receiving operation in the fading condition, or the like, a follow-up performance of the automatic gain control loop is degraded in the event that the generation or update period of the control signal of the automatic gain control loop is set and fixed as a relatively large value, conversely the follow-up performance of the automatic gain control loop is made too quick so that there is a possibility to cause harmful influences such as generation of an unstable state, generation of oscillation, etc. in the event that the generation or update period of the control signal of the automatic gain control loop is set and fixed as a relatively small value.

SUMMARY OF THE INVENTION

The present invention has been made in view of the above circumstances in the prior art, and it is an object of the present invention to provide an automatic gain control circuit which can optimize a follow-up performance of an automatic gain control loop to thus assure a good receiving operation by optimizing a generation timing or a generation period of a control signal for the automatic gain control loop even in the case where large variation in a receiving signal level is expected at the time of a turn-ON operation of a power supply, an intermittent receiving operation of a receiver device, a receiving operation in the fading condition, or the like, or the case where small variation in the receiving signal level is caused because the electric field condition is stabilized, a receiver device with such automatic gain control circuit, an automatic gain control method in a receiver device, and a recording medium.

Also, it is another object of the present invention to provide an automatic gain control method in a receiver device, which utilizes a DSP (digital signal processor) in an automatic gain control loop and which can optimize a follow-up performance of the automatic gain control loop to thus assure a good receiving operation even in the case where automatic gain control of a receiver system is carried out according to a software program, and a recording medium.

In order to achieve the above objects, there is provided an automatic gain control circuit according to first aspect of the present invention including a gain variable amplifier which controls an amplitude of a receiving signal based on a control signal, the circuit comprising a control signal generating means for level-detecting the receiving signal and then generating a feedback signal as the control signal for the gain variable amplifier, and a controlling means for deciding a generation timing of the control signal or a generation period of the control signal in response to a predetermined physical quantity and controlling the control signal generating means.

Also, in the automatic gain control circuit, the controlling means may include a look-up table which uses address information as the predetermined physical quantity and holds information of the generation timing of the control signal or the generation period of the control signal in response to the address information.

Also, in the automatic gain control circuit, the controlling means may decide the generation timing of the control signal or the generation period of the control signal using a lapsed time in operation of the automatic gain control circuit as the predetermined physical quantity.

Also, in the automatic gain control circuit, the controlling means may set the generation period of the control signal shorter than the generation period in a steady operation state, for a predetermined rise time from a non-operated state to the steady operation state when a power supply is turned on.

Also, in the automatic gain control circuit, the controlling means may set the generation period of the control signal shorter than the generation period in a steady operation state, for a predetermined rise time from a non-operated state to the steady operation state when an intermittent receiving operation is carried out.

Also, preferably, the automatic gain control circuit further comprises a detection output change amount detecting means for detecting an amount of change in a detected output of the receiving signal, wherein the controlling means decides the generation timing of the control signal or the generation period of the control signal using an amount of change in the detected output as the predetermined physical quantity.

Also, preferably, an automatic gain control circuit further comprises a fading pitch detecting means for detecting a fading pitch of the receiving signal, wherein the controlling means decides the generation timing of the control signal or the generation period of the control signal using the fading pitch as the predetermined physical quantity.

Also, a receiver device according to the present invention comprises the automatic gain control circuit as mentioned above.

Also, an automatic gain control method according to second aspect of the present in a receiver device including a gain variable amplifier which controls an amplitude of a receiving signal based on a control signal, comprises a control signal generating step of level-detecting the receiving signal and then generating a feedback signal as the control signal for the gain variable amplifier, and a controlling step of deciding a generation timing of the control signal or a generation period of the control signal in response to a predetermined physical quantity.

Also, in an automatic gain control method, the controlling step may decide the generation timing of the control signal or the generation period of the control signal using a lapsed time in operation of the receiver device as the predetermined physical quantity.

Also, in an automatic gain control method, the controlling step may set the generation period of the control signal shorter than the generation period in a steady operation state, for a predetermined rise time from a non-operated state to the steady operation state when a power supply is turned on.

Also, in an automatic gain control method, the controlling step may set the generation period of the control signal shorter than the generation period in a steady operation state, for a predetermined rise time from a non-operated state to the steady operation state when an intermittent receiving operation is carried out.

Also, preferably, an automatic gain control method further comprises a detected output change amount detecting step of detecting an amount of change in a detected output of the receiving signal, wherein the controlling step decides the generation timing of the control signal or the generation period of the control signal using an amount of change in the detected output as the predetermined physical quantity.

Also, preferably, an automatic gain control method further comprises a fading pitch detecting step of detecting a fading pitch of the receiving signal; wherein the controlling step decides the generation timing of the control signal or the generation period of the control signal using the fading pitch as the predetermined physical quantity.

Further, a computer-readable recording medium according to the present invention records the automatic gain control method mentioned above as a program to be executed by a computer.

In the automatic gain control circuit according to the present invention, when the receiving signal is level-detected by the control signal generating means (control signal generating step) to generate the feedback signal as the control signal for the gain variable amplifier, the generation timing of the control signal or the generation period of the control signal is decided by the controlling means (controlling step) in response to the predetermined physical quantity.

Accordingly, under various situations such as the case where large variation in the receiving signal level is expected, the case where small variation in the receiving signal level is caused because the electric field condition is stabilized, or the like, the generation timing or the generation period of the control signal for the automatic gain control loop can be decided by setting the physical quantity to respond to various conditions. As a result, the follow-up performance of the automatic gain control loop can be optimized in various situations, and thus the good receiving characteristic can be achieved.

Particularly, in the automatic gain control circuit while using address information as the predetermined physical quantity, information of the generation timing of the control signal or the generation period of the control signal are held in response to the address information in the look-up table, and then the generation timing or the generation period of the control signal for the gain variable amplifier is decided in answer to the predetermined physical quantity by referring to the look-up table.

Accordingly, under various situations such as the case where large variation in the receiving signal level is expected at the time of the turn-ON operation of the power supply, the intermittent receiving operation of the receiver device, the receiving operation in the fading condition, or the like, or the case where small variation in the receiving signal level is caused because the electric field condition is stabilized, the predetermined physical quantity can be set finely by referring to the look-up table upon optimization of the generation timing or the generation period of the control signal for the automatic gain control loop. Therefore, the follow-up performance of the automatic gain control loop can be optimized under various conditions, and thus the good receiving characteristic can be achieved correspondingly. Also, update of the method of generating the generation timing or the generation period of the control signal and also the data stored in the table can be performed simply by exchanging the look-up table.

Also, in the automatic gain control circuit according to the present invention, the generation timing of the control signal or the generation period of the control signal is decided by the controlling means (controlling step), while using the lapsed time in operation of the automatic gain control circuit or the receiver device including the automatic gain control circuit as the predetermined physical quantity.

Also, particularly, in the automatic gain control circuit, the generation period of the control signal is set shorter than the generation period in the steady operation state by the controlling means (controlling step), for a predetermined rise time from the non-operated state to the steady operation state when the power supply is turned on.

In this fashion, the generation timing or the generation period of the control signal can be decided in response to the lapsed time in operation of the automatic gain control circuit or the receiving device which is constructed to comprise the automatic gain control circuit. For a predetermined rise period from the non-operated state to the steady operation state when the power supply is turned ON, the generation period of the control signal can be set shorter than the generation period in the steady operation state so as to accelerate the response characteristic of the automatic gain control loop rather than that in the steady operation state.

Therefore, even in the case where large variation in the receiving signal level is expected at the time of the power supply ON, the generation timing or the generation period of the control signal for the automatic gain control loop can be optimized and also the follow-up performance of the automatic gain control loop can be optimized to thus assure the good receiving characteristic.

Also, particularly, in the automatic gain control circuit according to the present invention, the controlling means (the controlling step) sets the generation period of the control signal shorter than the generation period in a steady operation state, for a predetermined rise time from the non-operated state to the steady operation state when an intermittent receiving operation is carried out.

In this way, the generation timing or the generation period of the control signal can be decided in response to the lapsed time in operation of the automatic gain control circuit or the receiving device which is constructed to comprise the automatic gain control circuit. For a predetermined rise period from the non-operated state to the steady operation state when the receiver device carries out the intermittent receiving operation, the generation period of the control signal can be set shorter than the generation period in the steady operation state so as to accelerate the response characteristic of the automatic gain control loop rather than that in the steady operation state. Therefore, even in the case where large variation in the receiving signal level is expected at the time of the intermittent receiving operation of the receiver device, the generation timing or the generation period of the control signal for the automatic gain control loop can be optimized and also the follow-up performance of the automatic gain control loop can be optimized to thus assure the good receiving characteristic.

Also, in the automatic gain control circuit according to the present invention, the controlling means (controlling step) decides the generation timing of the control signal or the generation period of the control signal using an amount of change in the detected output of the receiving signal, which is detected by the detected output change amount detecting means (detected output change amount detecting step), as the predetermined physical quantity.

In this manner, the generation timing or the generation period of the control signal can be decided in response to an amount of change in the detected output of the detected receiving signal. Therefore, under various situations such as the case where large variation in the receiving signal level is expected, the case where small variation in the receiving signal level is caused because the condition of the electric field is stabilized, or the like, the generation timing or the generation period of the control signal for the automatic gain control loop can be optimized finely and also the follow-up performance of the automatic gain control loop can be optimized to thus assure the good receiving characteristic.

Furthermore, in the automatic gain control circuit according the present invention, the controlling means (controlling step) decides the generation timing or the generation period of the control signal using the fading pitch of the receiving signal, which is detected by the fading pitch detecting means (fading pitch detecting step), as the predetermined physical quantity.

In this manner, the generation timing or the generation period of the control signal can be decided in response to the fading pitch of the detected receiving signal. Therefore, even in the case where large variation in the receiving signal level is expected in receiving the receiving signal in the fading circumstance, the generation timing or the generation period of the control signal for the automatic gain control loop can be optimized and the follow-up performance of the automatic gain control loop can be optimized to thus assure the good receiving characteristic.

BRIEF DESCRIPTION OF THE DRAWINGS

FIG. 1 is a view showing a configuration of an automatic gain control circuit according to a first embodiment of the present invention;

FIG. 2B shows the case in the prior art;

FIG. 5A shows the case of the automatic gain control circuit according to the second embodiment, and FIG. 5B shows the case in the prior art;

FIG. 8A shows the case of the automatic gain control circuit according to the third embodiment, and FIG. 8B shows the case in the prior art;

FIG. 9 is a flowchart showing a method of deciding an integration period (integration timing) in the third embodiment;

DETAILED DESCRIPTION OF THE PREFERRED EMBODIMENTS

Embodiments of an automatic gain control circuit, a receiver device with such automatic gain control circuit, an automatic gain control method in a receiver device, and a recording medium according to the present invention will be explained in detail in the order from a first embodiment to a fifth embodiment with reference to the accompanying drawings hereinafter. In this case, in the following explanation of respective embodiments, the automatic gain control circuit, the receiver device with the automatic gain control circuit, and the automatic gain control method in the receiver device according to the present invention will be explained in detail, but it should be interpreted that, since the recording medium is used to record a program for carrying out the automatic gain control method, explanation of the recording medium according to the present invention is contained in the explanation of the automatic gain control method.

First Embodiment

Figure 13:
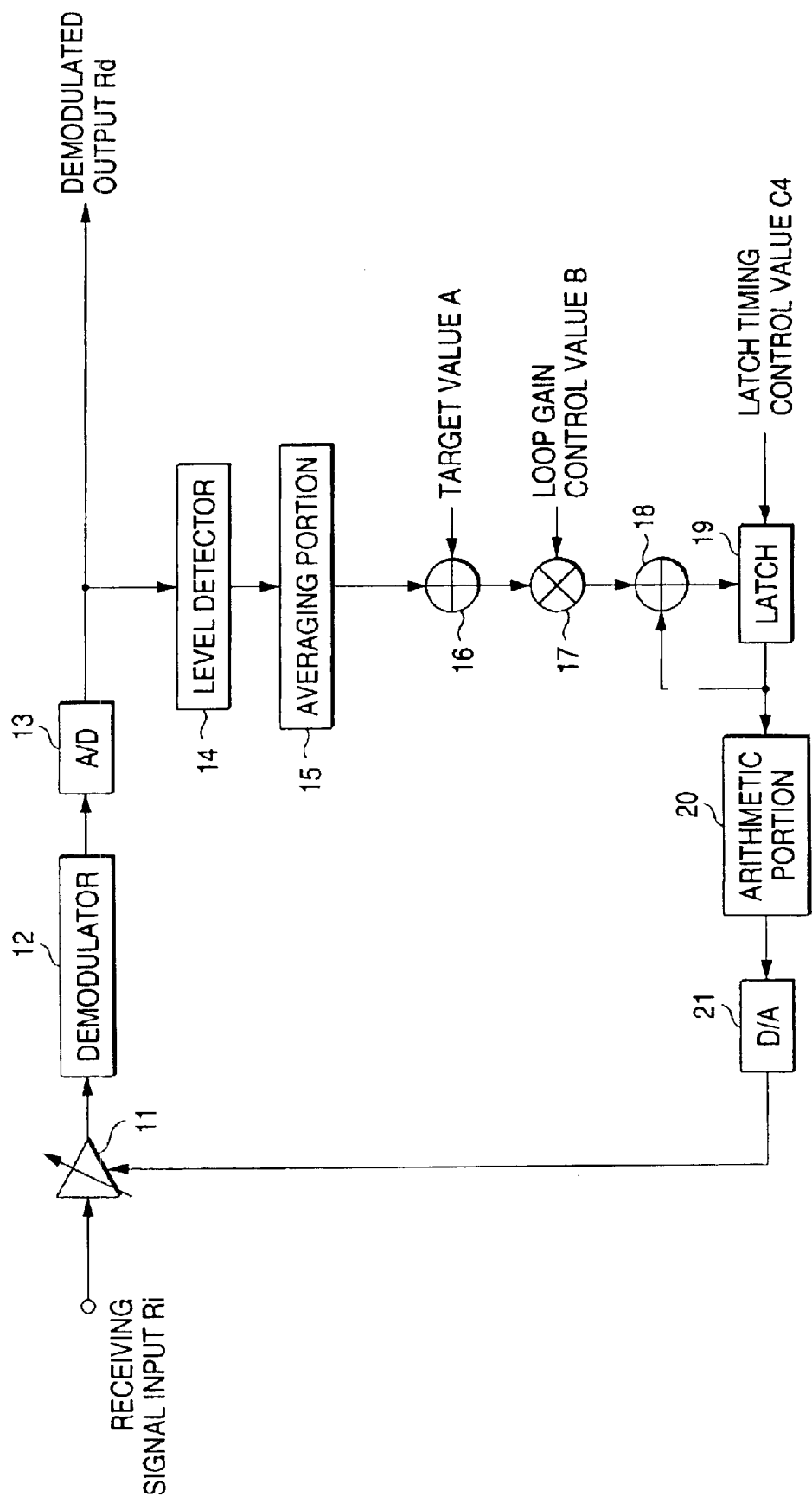
FIG. 13 is a view showing a configuration of an automatic gain control circuit in a receiver device in the prior art.

FIG. 1 is a view showing a configuration of an automatic gain control circuit according to a first embodiment of the present invention. The automatic gain control method according to the present invention is applied to the automatic gain control circuit. In FIG. 1, like reference symbols are affixed to the same or similar parts as those in FIG. 13 (the prior art).

In FIG. 1, the automatic gain control circuit according to the present invention is constructed to comprises a gain variable amplifier 11, a demodulator portion 12, an A/D converter 13, a level detector 14, an averaging portion 15, a difference-in-converged value calculating adder 16, a loop gain controlling multiplier 17, an adder 18 in an integrator circuit portion, a latch circuit 19 in an integrator circuit portion, an arithmetic portion 20, a D/A converter 21, and a control portion 25.

The gain variable amplifier 11, the demodulator portion 12, and the A/D converter 13 construct a receiver system which receives a receiving signal input Ri and then outputs a demodulated output Rd. The level detector 14, the averaging portion 15, the difference-in-converged value calculating adder 16, the loop gain controlling multiplier 17, the adder 18 in an integrator circuit portion, the latch circuit 19 in an integrator circuit portion, the arithmetic portion 20, and the D/A converter 21 construct an automatic gain control loop. In this case, the automatic gain control loop corresponds to a control signal generating means set forth in claims. Also, the control portion 25 can be implemented by a processing means such as a microprocessor, etc., and corresponds to a controlling means set forth in claims.

First, in the receiver system, the gain variable amplifier 11 can change its gain in response to a potential of the control signal GC which is generated by the automatic gain control loop. The demodulator portion 12 demodulates the amplified receiving signal (Ri), and the A/D converter 13 converts the demodulated signal into a digital signal and then outputs a demodulated output Rd.

Also, in the automatic gain control loop, a signal level of the demodulated output Rd is first detected by the level detector 14. Then, the detected signal level is averaged for a predetermined time by the averaging portion 15. Then, a difference between output data from the averaging portion 15 and a converged level target value A of the input for the A/D converter 13 is calculated by the difference-in-converged value calculating adder 16. Then, the loop gain control value B is multiplied by the loop gain controlling multiplier 17 to control the loop gain in the automatic gain control loop. The addition result is latched by the adder 18 and the latch circuit 19 in the integrator circuit portion at a timing based on a latch timing control signal C1 supplied from the control portion 25 to execute the data integration.

In addition, control voltage data for the gain variable amplifier 11 are generated from the integral data by the arithmetic portion 20. This control voltage data are then converted into the analogue value by the D/A converter 21, and then supplied to the gain variable amplifier 11 in the receiver system as the control signal GC which has a potential defined by the automatic gain control loop.

Here, an approach executed by the control portion 25 to decide a generation timing or generation period of the control signal GC will be explained hereunder. AS mentioned above, the control portion 25 outputs the latch timing control signal C1 to control a timing at which the output of the adder 18 is latched by the latch circuit 19 in the integrator circuit portion, and the preceding loop gain data in the automatic gain control loop is held in the latch circuit 19. Since the addition result to which an amount of change in the loop gain data is added by the adder 18 is latched by a trigger of the latch timing control signal C1, the generation timing of the control signal GC can be defined by the latch timing control signal C1. As a result, a period of the trigger of the latch timing control signal C1 corresponds to the generation timing of the control signal GC.

The automatic gain control circuit according to the first embodiment is able to decide the generation timing or the generation period of the control signal GC in response to a lapsed time after the operation of the automatic gain control circuit or the receiving device which is constructed to comprise the automatic gain control circuit has been started. More particularly, the automatic gain control circuit according to the first embodiment is characterized in that, for a predetermined rise period from a non-operated state to a steady operation state when the power supply of the receiver device is shifted from its OFF state to its ON state (when the power supply is turned ON), the generation period of the control signal GC can be set shorter than the generation period in the steady operation state so as to accelerate the response characteristic of the automatic gain control loop rather than that in the steady operation state, and then the shorter generation period can be switched to the generation period in the steady operation state after the predetermined time.

Figure 2A:
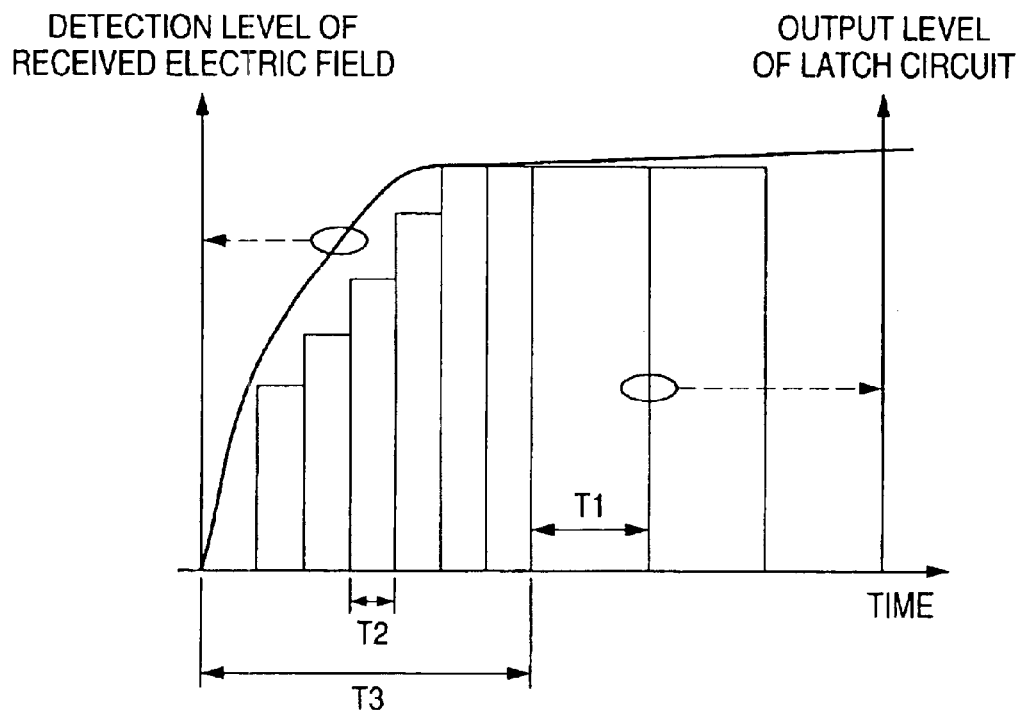
FIGS. 2A and 2B are views showing a follow-up performance of an automatic gain control loop in a rise condition of a receiver device from a non-operated state (initial state) to a steady operation state when a power supply of the receiver device is turned ON, FIG. 2A shows the case of the automatic gain control circuit according to the first embodiment.
Figure 2B:
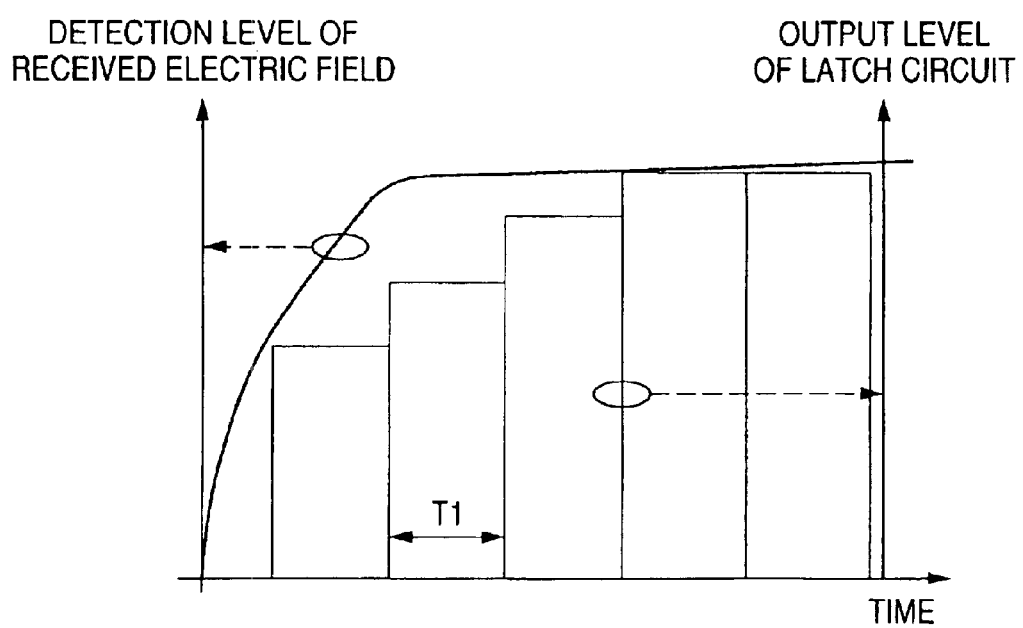
Figure 3:
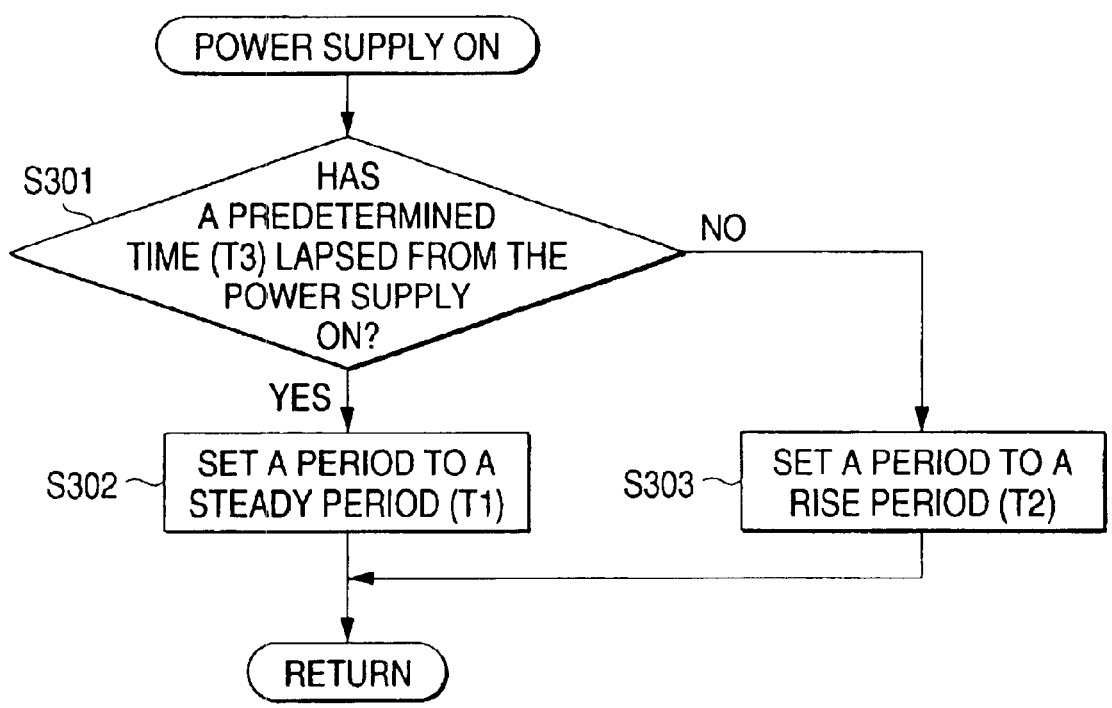
FIG. 3 is a flowchart showing a method of deciding a generation period of a control signal, which is executed by a control portion in the first embodiment.

The method of deciding the generation period of the control signal GC to achieve such feature will be explained with reference to FIG. 2 and FIG. 3 hereunder. FIG. 2 is a view showing a follow-up performance of an automatic gain control loop in a rise condition of a receiver device from a non-operated state (initial state) to a steady operation state when a power supply of the receiver device is turned ON. FIG. 2A shows the case of the automatic gain control circuit according to the first embodiment, and FIG. 2B shows the case in the prior art. FIG. 3 is a flowchart showing the method of deciding the generation period of the control signal GC executed by the control portion 25.

To begin with, the problems of the automatic gain control circuit in the prior art shown in FIG. 2B will be explained hereunder. Normally, if the follow-up performance of the automatic gain control loop relative to the level variation is taken into consideration, the generation period T1 [s] of the control signal GC of the automatic gain control loop is set smaller. In such case, since the automatic gain control loop follows an envelope of the received modulated wave to cause deterioration of the receiving characteristic, to become unstable against the sudden level variation, to cause bad effects such as the oscillation, etc., or the like, there is limitations on such smaller setting of the generation period. Accordingly, in the prior art, even if the large level variation is caused, for example, at the time of the rise period from the non-operated state to the steady operation state when the power supply of the receiver device is shifted from its OFF state to its ON state, the generation period of the control signal GC of the automatic gain control loop is set to T1 [s]

(e.g., 5 [ms]) which is equal to that in the steady operation state. Therefore, the follow-up performance of the automatic gain control loop is deteriorated in some cases.

On the contrary, in the automatic gain control circuit according to the first embodiment, as shown in FIG. 2A, in order to overcome the above problems in the prior art, the generation period of the control signal GC is set to the generation period T2 [s] (e.g., 1 [ms]) of the control signal GC, which is shorter than the generation period T1 [s] (e.g., 5 [ms]) of the control signal GC in the steady operation state, at the time of the rise operation of the receiving device such that the response characteristic of the automatic gain control loop can be accelerated rather than the steady operation state to improve the follow-up performance. After this, the generation period of the control signal GC is switched to the generation period T1 [s] of the control signal GC in the steady operation state at a lapsed time T3 [s] at which completion of the rise operation of the detected level of a received electric field is assumed.

In other words, in a flowchart shown in FIG. 3, in step S303, the control portion 25 sets the generation period of the control signal GC to T2 [s], which is shorter than that in the steady operation state, from the power supply ON to the lapsed time T3 [s]. In step S302, after the lapsed time T3 has lapsed from the power supply ON, the control portion 25 sets the generation period of the control signal GC to T1 [s] which must be set in the steady operation state. Then, the trigger of the latch timing control signal C1 is generated based on the set generation period. In this case, counting of the time from the power supply ON is made by a software timer in the microprocessor, and the software timer is reset at the time of the power supply ON.

In this manner, because the generation period T2 [s] of the control signal GC of the automatic gain control loop is set shorter than the generation period T1 [s] in the steady operation state at the time of the rise period from the non-operated state to the steady operation state when the power supply of the receiver device is shifted from its OFF state to its ON state, the follow-up performance of the automatic gain control loop at the time of the rise operation and the pull-in of the automatic gain control loop can be improved.

Next, operations of the receiver system and the automatic gain control loop in the automatic gain control circuit according to the first embodiment will be explained with reference to FIG. 1 hereunder. First, when a receiving signal input Ri is input, such receiving signal input Ri is amplified by the gain variable amplifier 11, then demodulated by the demodulator portion 12, and then converted into a digital value by the A/D converter 13 to be output as a demodulated output Rd. Here, a part of the demodulated output Rd as an output of the receiver system is level-detected by the level detector 14 and then send out to the automatic gain control loop.

Then, in the automatic gain control loop, the data which are level-detected by the level detector 14 are subjected to the averaging process by the averaging portion 15 for a predetermined time. For example, an interval average of the data is calculated for 0.625 [ms] and then latched, and then a moving average of the data is calculated subsequently for the time which is an integral multiple of 0.625 [ms]. Then, a difference between an output of the averaging portion 15 and a constant target level (e.g., 0.5 [Vp-p]) of the target value A is calculated by the adder 16 so as to converge such output into the input for the A/D converter 13. Then, an output of the adder 16 is multiplied by the loop gain control value B by the multiplier 17 to control the loop gain in the automatic gain control loop.

Then, an output of the multiplier 17 is input into an integrator circuit portion, which consists of the adder 18 and the latch circuit 19, as an amount of change from the preceding loop gain data which are output from the automatic gain control loop. Then, such amount of change supplied from the multiplier 17 is added to the preceding loop gain data, which are latched in the latch circuit 19, by the adder 18. Then, the addition result is latched and integrated by the latch circuit 19 at a trigger of the latch timing control signal C1 which is generated based on the generation period of the control signal GC which is decided by the control portion 25.

The integral data integrated by the integrator circuit portion are converted into data which are equivalent to the control voltage for the gain variable amplifier 11 by the arithmetic portion 20. Then, the arithmetic result is converted into an analogue voltage by the D/A converter 21, and then fed back as the control voltage for the gain variable amplifier 11 based on the data.

As the parameters of the interval average and the moving average of the data in the averaging portion 15, the data calculated from the arithmetic process by the DSP, etc. may be employed, otherwise the data obtained by referring to a numerical value translation table as a look-up table which is stored in the ROM, etc. may be employed. In addition, concerning other parameters, as the target value A added by the adder 16 and the loop gain control value B multiplied by the multiplier 17, similarly the data calculated from the arithmetic process by the DSP, etc. may be employed, otherwise the data obtained by referring to a numerical value translation table as a look-up table which is stored in the ROM, etc. may be employed.

In turn, as a first variation of the automatic gain control circuit according to the first embodiment, a variation in which a numerical value translation table (look-up table) is employed as the control portion 25 will be explained hereunder. In this case, the control portion 25 is constructed, for example, by incorporating a timer circuit (counter) which counts a time lapsed from the power supply ON and a memory such as the ROM, etc. in which the numerical value translation table is stored into the microprocessor. The timer circuit is reset at the time of the power supply ON, and outputs a lapsed time from the power supply ON as an address to the memory. The memory holds the generation period of the control signal GC in the address (lapsed time), so that the generation period of the control signal GC which corresponds to the operation lapsed time of the automatic gain control circuit is supplied to the microprocessor. Then, the trigger of the latch timing control signal C1 is generated based on the generation period of the control signal GC by the microprocessor.

In the event that the generation period is set to have the above process contents shown in FIG. 3, if the timer circuit counts the lapsed time T3 to then output as the address the signal indicating whether or not the time T3 has passed, only the data of the generation periods T1, T2 may be held in the memory. In other words, if the addressing for the memory is designed in another way, an amount of data of the generation period which is held in the memory can be reduced. If such numerical value translation table (look-up table) is employed, the method of generating the generation period of the control signal GC and the generation period data per se can be changed simply by exchanging the ROM, etc.

Next, as a second variation of the automatic gain control circuit according to the first embodiment, a variation in which the digital signal processor (DSP) is employed in the automatic gain control loop will be explained hereunder. In this case, for example, the level detector 14, the averaging portion 15, the difference-in-converged value calculating adder 16, the loop gain controlling multiplier 17, the adder 18 in an integrator circuit portion, the latch circuit 19 in an integrator circuit portion, the arithmetic portion 20, the D/A converter 21, and the control portion 25 can be implemented by the DSP. The procedures in a software program (automatic gain control method) which is executed on the DSP at this time will be explained with reference to a flowchart shown in FIG. 4. Processes shown in the flowchart in FIG. 4 correspond to a control signal generating step set forth in claims, and processes shown in the flowchart in FIG. 3 correspond to a control step.

First, in step S401, when the receiving signal Ri is input into the receiver system, the input signal is amplified by the gain variable amplifier 11, then demodulated by the demodulator portion 12, then converted into the digital value by the A/D converter 13, and then output as the demodulated signal Rd. Here the DSP receives a part of the demodulated signal Rd from the receiver system.

In step S402, the level detection of the data is executed. In step S403, the level-detected data are then subjected to the averaging process for a certain time. For example, the interval average of the data is calculated for 0.625 [ms] and then latched, and then the moving average of the data is calculated thereafter for the time which is an integral multiple of 0.625 [ms]. In step S404, the difference between the output of the averaging portion 15 and the constant target level (e.g., 0.5 [Vp-p]) of the target value A is then calculated so as to converge the output into the input for the A/D converter 13. In step S405, the output of the adder 16 is then multiplied by the loop gain control value B to control the loop gain in the automatic gain control loop. In step S406, the multiplied result instep S405 is then added (integrated) to preceding control data as the amount of change from the loop gain data being output from the automatic gain control loop.

In step S407, the data which have been integrated in step S406 are convert into data (analogue value) corresponding to the control voltage for the gain variable amplifier 11, and then fed back to the gain variable amplifier 11 as the control voltage. In step S408, the gain control of the gain variable amplifier 11 is carried out.

In this case, the parameters of the interval average and the moving average, the target value A in step S404, and the loop gain control value B in step S405 are similar to those employed in the above automatic gain control circuit. Also, the processes in the automatic gain control circuit according to the above first embodiment (see the flowchart in FIG. 3) are similarly performed at the addition (integral) timing of the control data in step S406. In other words, the generation period of the control signal GC is set to the shorter generation period T2 [s] at the time of the rise operation of the receiving device such that the response characteristic of the automatic gain control loop can be accelerated rather than the steady operation state to improve the follow-up performance, and then the generation period of the control signal GC is switched to the generation period T1 [s] in the steady operation state after the time T3 [s] at which completion of the rise operation of the detected level of the received electric field is assumed has lapsed.

As described above, according to the first embodiment and the first and second variations of the first embodiment, the generation timing or the generation period of the control signal GC can be decided in response to the lapsed time in operation of the automatic gain control circuit or the receiving device which is constructed to comprise the automatic gain control circuit. More specifically, for a predetermined rise period from the non-operated state to the steady operation state when the power supply of the receiver device is shifted from its OFF state to its ON state (when the power supply is turned ON), the generation period T2 [s] of the control signal GC can be set shorter than the generation period T1 [s] in the steady operation state so as to accelerate the response characteristic of the automatic gain control loop rather than that in the steady operation state, and then such shorter generation period can be switched to the generation period in the steady operation state after the predetermined time T3 [s]. Therefore, even in the case where large variation in the receiving signal level is expected at the time of the turn-ON operation of the power supply, or the case where small variation in the receiving signal level is caused because the condition of the electric field is stabilized, the generation timing or the generation period of the control signal for the automatic gain control loop can be optimized and the follow-up performance of the automatic gain control loop can be optimized to thus assure the good receiving characteristic.

Second Embodiment

Next, an automatic gain control circuit and an automatic gain control method employed in the receiver device including the automatic gain control circuit according to the second embodiment of the present invention will be explained hereunder. A circuit configuration of the automatic gain control circuit according to the second embodiment is similar to that in the first embodiment (FIG. 1), but an approach for deciding the generation timing or the generation period of the control signal GC in the control portion 25 is different.

In FIG. 1, like the first embodiment, the control portion 25 outputs the latch timing control signal C1 to control the timing at which an output of the adder 18 in the integrator circuit portion is latched by the latch circuit 19. The preceding loop gain data in the automatic gain control loop are held in the latch circuit 19, and the result which is obtained by adding an amount of change in the loop gain data by the adder 18 is latched by the trigger of the latch timing control signal C1. Therefore, the latch timing control signal C1 can define the generation timing of the control signal GC, and the trigger period of the latch timing control signal C1 coincides with the generation period of the control signal GC.

The automatic gain control circuit according to the second embodiment is able to decide the generation timing or the generation period of the control signal GC in response to the lapsed time after the operation of the automatic gain control circuit or the receiving device which is constructed to comprise the automatic gain control circuit has been started. More particularly, the automatic gain control circuit according to the second embodiment is characterized in that, for a predetermined rise period from the non-operated state to the steady operation state when the receiver device carries out its intermittent receiving operation, the generation period of the control signal GC can be set shorter than the generation period in the steady operation state so as to accelerate the response characteristic of the automatic gain control loop rather than that in the steady operation state, and then such shorter generation period can be switched to the generation period in the steady operation state after the predetermined time.

Figure 5A:
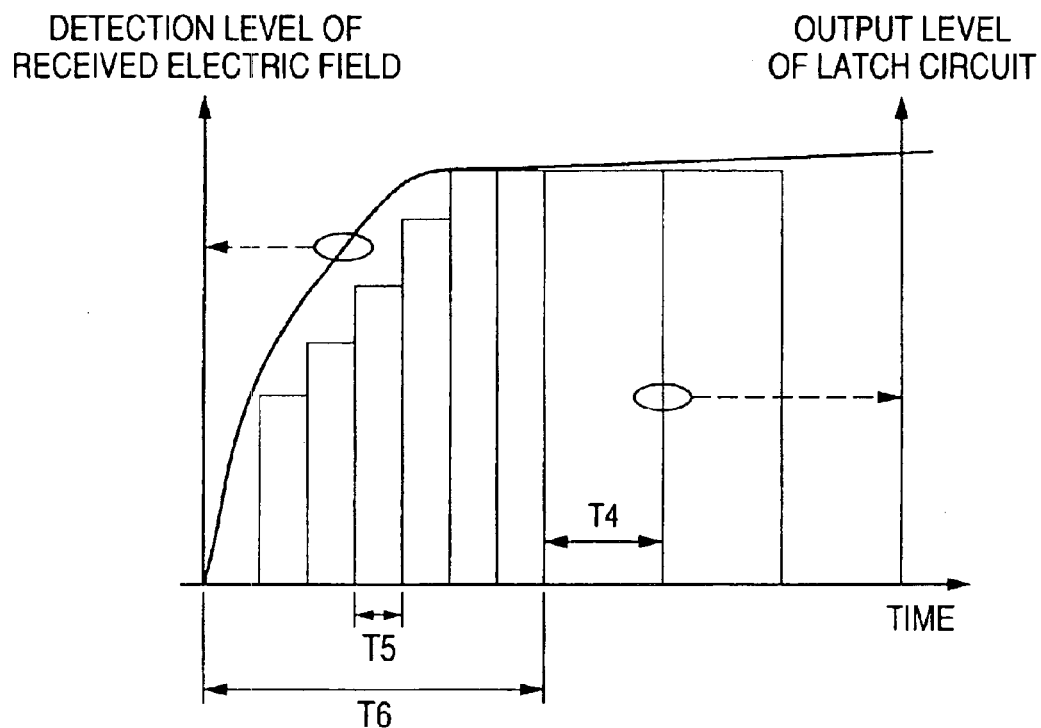
FIGS. 5A and 5B are views showing a follow-up performance of an automatic gain control loop in a rise condition of a receiver device from the non-operated state (initial state) to the steady operation state when the receiver device carries out intermittent reception.
Figure 5B:
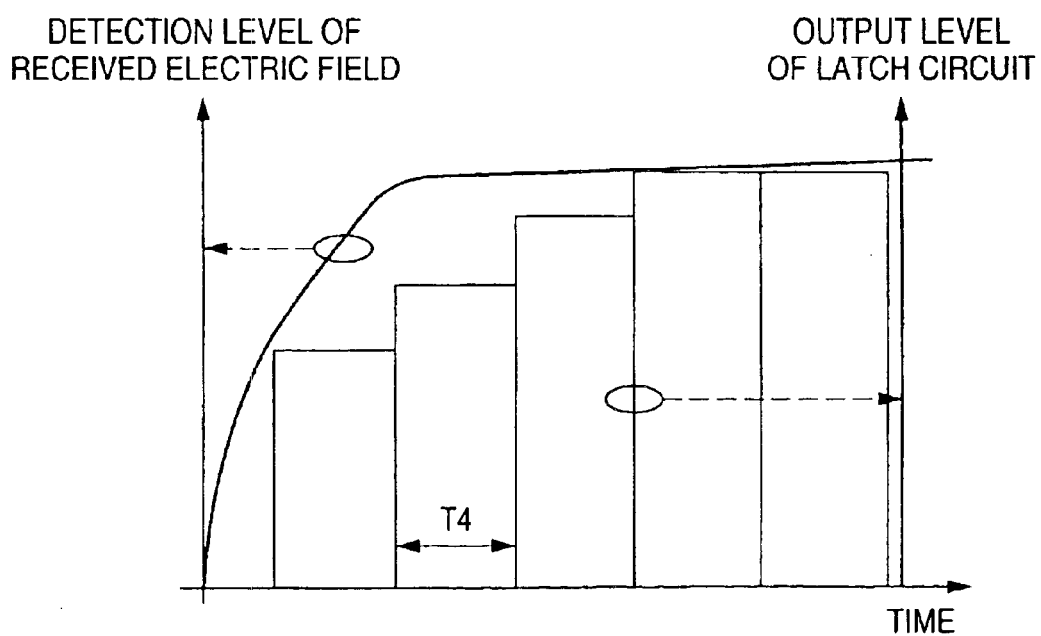
Figure 6:
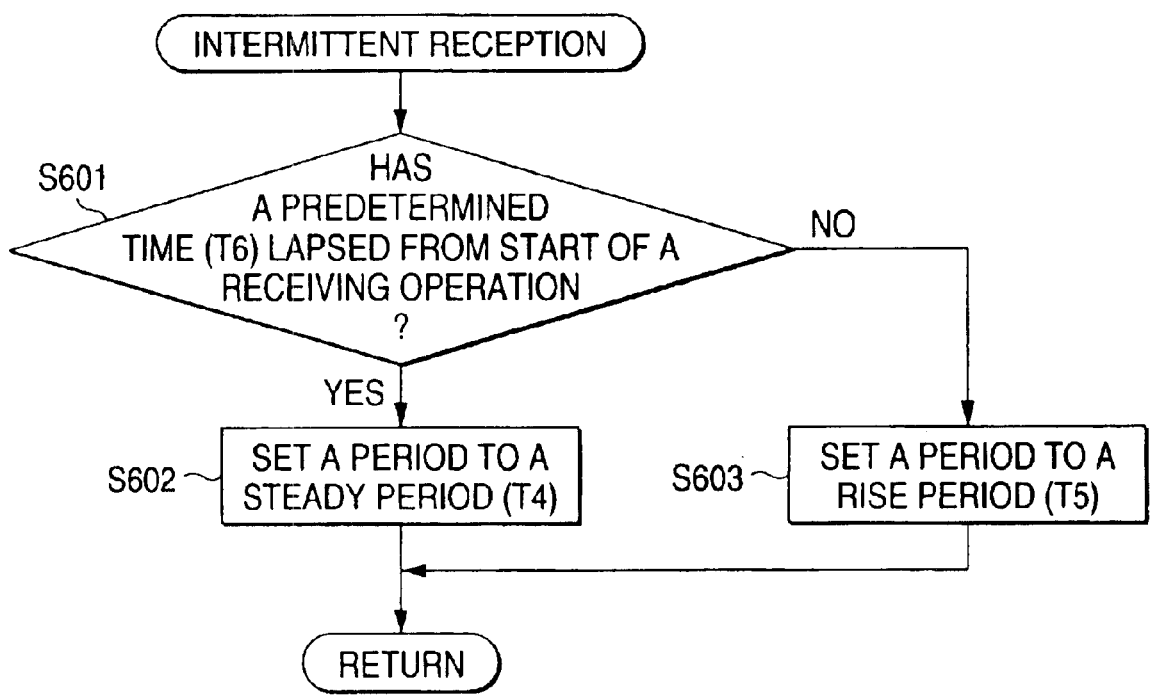
FIG. 6 is a flowchart showing a method of deciding a generation period of a control signal, which is executed by a control portion in a second embodiment.

A method of deciding the generation period of the control signal GC which is characterized as above will be explained with reference to FIG. 5 and FIG. 6 hereunder. FIG. 5 is a view showing the follow-up performance of the automatic gain control loop in the rise condition of the receiver device from the non-operated state (initial state) to the steady operation state when the receiver device carries out intermittent receiving operation. FIG. 5A shows the case of the automatic gain control circuit according to the second embodiment, and FIG. 5B shows the case of the automatic gain control circuit in the prior art. FIG. 6 is a flowchart showing the method of deciding the generation period of the control signal GC, which is executed by the control portion 25.

First, the problems in the automatic gain control circuit in the prior art shown in FIG. 5B will be explained. Normally, if the follow-up performance of the automatic gain control loop relative to the level variation is taken into consideration, the generation period T4 [s] of the control signal GC of the automatic gain control loop is set smaller. In such case, since the automatic gain control loop follows the envelope of the received modulated wave to thus cause deterioration of the receiving characteristic, to become unstable against the sudden level variation, to cause bad effects such as the oscillation, etc., or the like, limitations are imposed on such smaller setting of the generation period. Accordingly, in the prior art, even if the large level variation is caused, for example, at the time of the rise period from the non-operated state to the steady operation state when the receiver device carries out its intermittent receiving operation, the generation period of the control signal GC of the automatic gain control loop is set to T4 [s] (e.g., 5 [ms]) which is equal to that in the steady operation state. Therefore, the follow-up performance of the automatic gain control loop is deteriorated in some cases.

In contrast, in the automatic gain control circuit according to the second embodiment, as shown in FIG. 5A, in order to overcome the above problems in the prior art, the generation period of the control signal GC is set to the generation period T5 [s] (e.g., 1 [ms]) of the control signal GC, which is shorter than the generation period T4 [s] (e.g., 5 [ms]) of the control signal GC in the steady operation state, in the rise period of the intermittent receiving operation such that the response characteristic of the automatic gain control loop can be accelerated rather than the steady operation state to improve the follow-up performance. After this, the generation period of the control signal GC is switched to the generation period T4 [s] of the control signal GC in the steady operation state at a lapsed time T6 [s] at which completion of the rise operation of the detected level of the received electric field is assumed.

In other words, in a flowchart shown in FIG. 6, in step S603, the control portion 25 sets the generation period of the control signal GC to T5 [s], which is shorter than that in the steady operation state, from the non-operated state to the lapsed time T6 [s] in the rise period. In step S602, after the lapsed time T6 has lapsed, the control portion 25 sets the generation period of the control signal GC to T4 [s] which must be set in the steady operation state. Then, the trigger of the latch timing control signal C1 is generated based on the set generation period. In this case, counting of the time is made by the software timer in the microprocessor, and the software timer is reset at the time when the receiver device enters into the receiving operation.

In this way, because the generation period T5 [s] of the control signal GC of the automatic gain control loop is set shorter than the generation period T4 [s] in the steady operation state in the rise period from the non-operated state to the steady operation state when the receiver device carries out its intermittent receiving operation, the follow-up performance of the automatic gain control loop at the time of the rise operation and the pull-in of the automatic gain control loop can be improved.

Operations of the receiver system and the automatic gain control loop in the automatic gain control circuit according to the second embodiment are similar to those in the above automatic gain control circuit according to the first embodiment, and first and second variations can be similarly applied like the automatic gain control circuit according to the first embodiment. In this case, when the first variation (configuration in which the look-up table is employed) is applied, care must be taken in that, unlike the above automatic gain control circuit according to the first embodiment, the timer circuit is reset when the automatic gain control circuit is shifted from the non-operated state to the operated state in the intermittent receiving operation.

As described above, according to the automatic gain control circuit of the second embodiment, the generation timing or the generation period of the control signal GC can be decided in response to the lapsed time in operation of the automatic gain control circuit or the receiving device which is constructed to comprise the automatic gain control circuit. In other words, for a predetermined rise period from the non-operated state to the steady operation state when the receiver device carries out the intermittent receiving operation, the generation period T5 [s] of the control signal GC can be set shorter than the generation period T4 [s] in the steady operation state so as to accelerate the response characteristic of the automatic gain control loop rather than that in the steady operation state, and then such shorter generation period can be switched to the generation period in the steady operation state after the predetermined time T6 [s]. Therefore, even in the case where large variation in the receiving signal level is expected at the time of the intermittent receiving operation of the receiver device, or the case where small variation in the receiving signal level is caused because the condition of the electric field is stabilized, the generation timing or the generation period of the control signal for the automatic gain control loop can be optimized and also the follow-up performance of the automatic gain control loop can be optimized to thus assure the good receiving characteristic.

Third Embodiment

Figure 7:
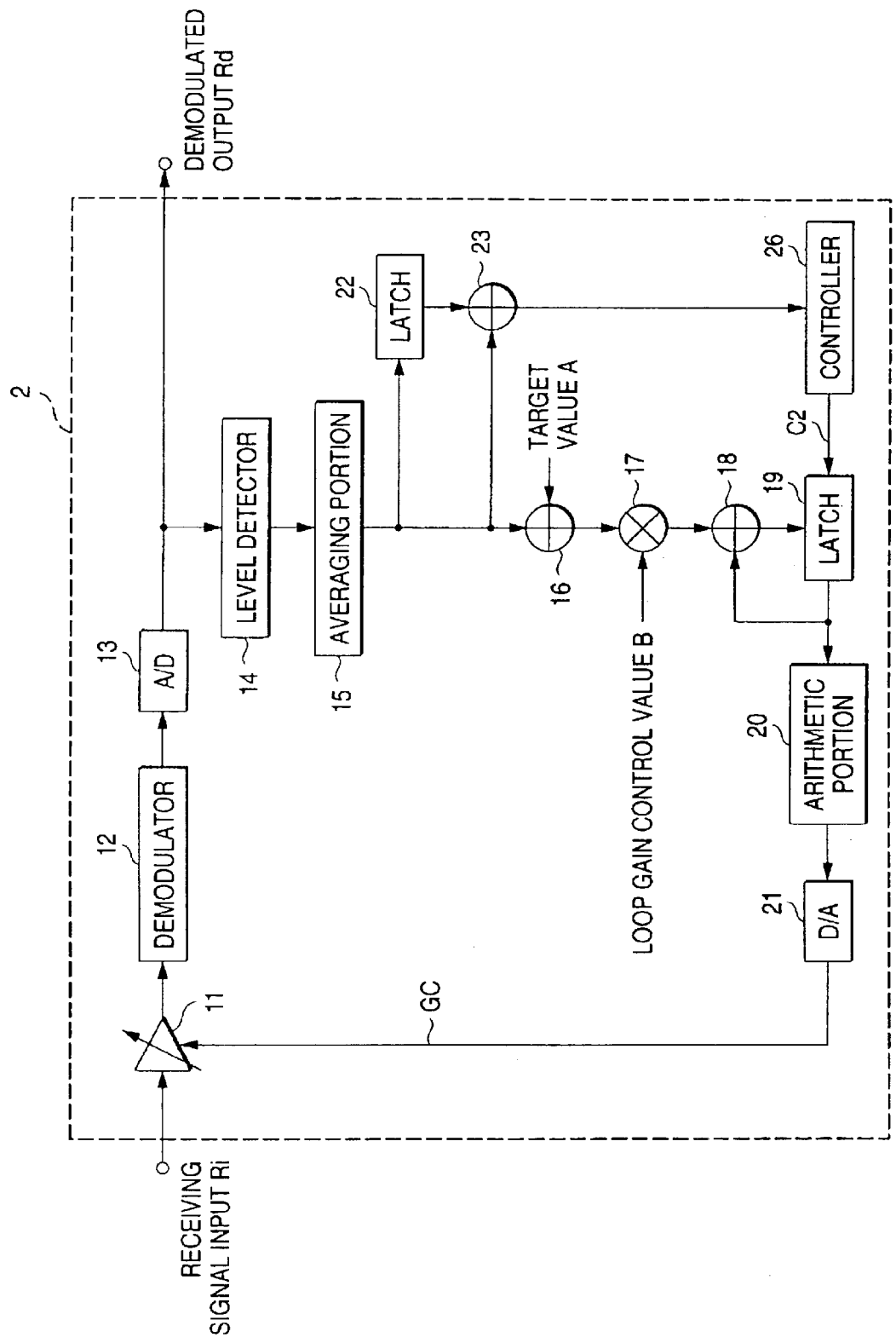
FIG. 7 is a view showing a configuration of an automatic gain control circuit according to a third embodiment of the present invention.

FIG. 7 is a view showing a configuration of an automatic gain control circuit according to a third embodiment of the present invention, and an automatic gain control method according to the present invention is applied to the automatic gain control circuit. In FIG. 7, like reference symbols are affixed to the same or similar parts as those in FIG. 1 (first embodiment).

In FIG. 7, the automatic gain control circuit according to the third embodiment is constructed to comprises the gain variable amplifier 11, the demodulator portion 12, the A/D converter 13, the level detector 14, the averaging portion 15, the difference-in-converged value calculating adder 16, the loop gain controlling multiplier 17, the adder 18 in the integrator circuit portion, the latch circuit 19 in the integrator circuit portion, the arithmetic portion 20, the D/A converter 21, a latch circuit 22, an adder 23, and a control portion 26.

The gain variable amplifier 11, the demodulator portion 12, and the A/D converter 13 construct a receiver system which receives the receiving signal Ri and then outputs the demodulated output Rd. The level detector 14, the averaging portion 15, the difference-in-converged value calculating adder 16, the loop gain controlling multiplier 17, the adder 18 in the integrator circuit portion, the latch circuit 19 in the integrator circuit portion, the arithmetic portion 20, and the D/A converter 21 construct the automatic gain control loop. In this case, the automatic gain control loop corresponds to a control signal generating means set forth in claims. Also, the control portion 26 can be implemented by a processing means such as a microprocessor, etc., and corresponds to a controlling means set forth in claims. In addition, the level detector 14, the averaging portion 15, the latch circuit 22, and the adder 23 correspond to a detected output change amount detecting means set forth in claims.

Since configurations of the receiver system and the automatic gain control loop according to the third embodiment are the same as those in the first embodiment, their functional explanation and their operational explanation will be omitted. In other words, the circuit configuration of the automatic gain control circuit according to the third embodiment can be implemented by adding the latch circuit 22 and the adder 23, both serve as the detected output change amount detecting means together, to the configuration of the first embodiment (FIG. 1), and is characterized by an approach for deciding the generation timing or the generation period of the control signal GC in the control portion 26.

In FIG. 7, like the first embodiment, the control portion 26 outputs the latch timing control signal C2 to control the timing at which an output of the adder 18 in the integrator circuit portion is latched by the latch circuit 19. The preceding loop gain data in the automatic gain control loop are held in the latch circuit 19, and the result which is obtained by adding an amount of change in the loop gain data by the adder 18 is latched by the trigger of the latch timing control signal C2. Therefore, the latch timing control signal C2 can define the generation timing of the control signal GC, and the trigger period of the latch timing control signal C2 coincides with the generation period of the control signal GC.

The automatic gain control circuit according to the third embodiment is characterized in that the generation period (generation timing) of the control signal GC can be decided in accordance with an amount of change in the level-detected output of the demodulated output Rd which is detected by the detected output change amount detecting means (the level detector 14, the averaging portion 15, the latch circuit 22, and the adder 23).

Figure 8A:
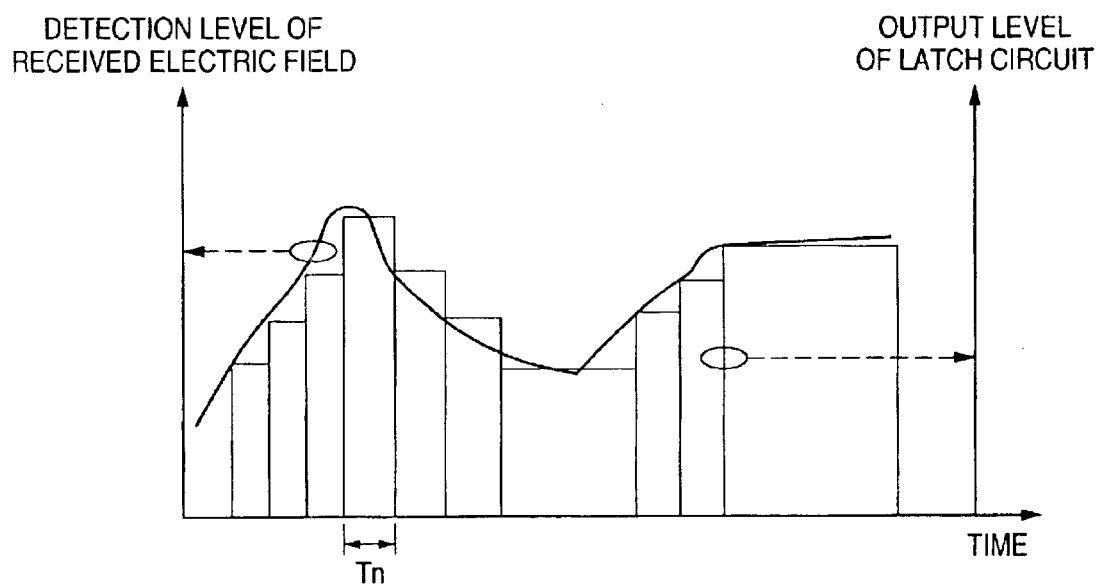
FIGS. 8A and 8B are views showing a follow-up performance of an automatic gain control loop of a receiver device.
Figure 8B:
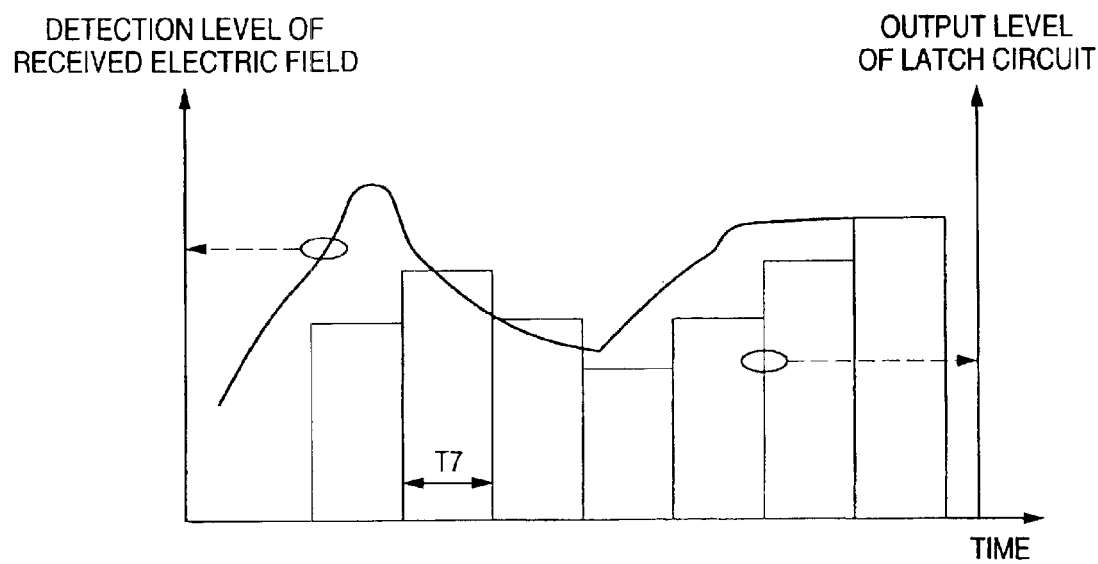

A method of deciding the generation period of the control signal GC which is characterized as above will be explained with reference to FIG. 8 hereunder. FIG. 8 is a view showing the follow-up performance of the automatic gain control loop of the receiver device. FIG. 8A shows the case of the automatic gain control circuit according to the third embodiment, and FIG. 8B shows the case of the automatic gain control circuit in the prior art.

First, in the automatic gain control circuit in the prior art shown in FIG. BB, since the generation period T7 [s] of the control signal of the automatic gain control is set to a constant value irrespective of the level variation of the automatic gain control loop, the follow-up performance of the automatic gain control loop against the abrupt variation in the detected level of the received electric field is sometimes degraded.

In contrast, in the automatic gain control circuit according to the third embodiment, as shown in FIG. 8A, since the generation period Tn [s] of the control signal GC can be decided in answer to an amount of change the electric field detected level by detecting the electric field detected level, it should be understood that the control signal GC can always be generated at an optimal generation period (generation timing) and thus the follow-up performance of the automatic gain control loop can be improved rather than the prior art.

Operations of the detected output change amount detecting means (the latch circuit 22 and the adder 23) and the control portion 26 will be explained in detail based on the above explanation.

To begin with, in the initial state when the automatic gain control circuit starts its operation, latch data in the latch circuit 22 may be set arbitrarily to any value, and also a certain value is output from the gain variable amplifier 11 according to the voltage of the control signal GC output by the automatic gain control loop. As a result, according to the change in the output signal level after the gain of the gain variable amplifier 11 is changed, outputs of the demodulator portion 12, the A/D converter 13, the level detector 14, and the averaging portion 15 are also changed. The preceding data are latched by the latch circuit 22, and a difference between a changed output of the averaging portion 15 and the preceding data in the latch circuit 22 is calculated by the adder 23, and then the result is supplied to the control portion 26 as an amount of change in the detected level. The control portion 26 sets the optimum generation period of the control signal GC in response to an amount of change in the detected level, and then outputs the trigger of the latch timing control signal C2 to the latch circuit 19 in the integrator circuit portion based on such generated period.

The integrator circuit portion integrates an amount of change in the loop gain data by updating the data in the latch circuit 19 by the trigger of the latch timing control signal C2. In addition, the integral data integrated by the integrator circuit portion are converted into data which are equivalent to the control voltage for the gain variable amplifier 11 by the arithmetic portion 20. Then, the arithmetic result is converted into an analogue value by the D/A converter 21, and then fed back to the gain variable amplifier 11 as the control voltage based on the data.

Next, as a first variation of the automatic gain control circuit according to the third embodiment, a variation in which a numerical value translation table (look-up table) is employed in the control portion 26 will be explained hereunder. In this case, the control portion 26 is constructed, for example, by incorporating a memory such as the ROM, etc., in which the numerical value translation table is stored, into the microprocessor. The memory holds the generation period of the control signal GC in answer to an amount of change in the detected level. The memory receives an output of the detected output change amount detecting means (the adder 23) as the address and then supplies the generation period of the control signal GC to the microprocessor. Then, the microprocessor generates the trigger of the latch timing control signal C2 based on the generation period of the control signal GC. If such numerical value translation table (look-up table) is employed, update of the generation period data of the control signal GC can be conducted simply by exchanging the ROM, etc.

Next, as a second variation of the automatic gain control circuit according to the third embodiment, a variation in which the digital signal processor (DSP) is employed in the automatic gain control loop will be explained hereunder. In this case, for example, configurations of the automatic gain control loop (the level detector 14, the averaging portion 15, the difference-in-converged value calculating adder 16, the loop gain controlling multiplier 17, the adder 18 in the integrator circuit portion, the latch circuit 19 in the integrator circuit portion, the arithmetic portion 20, and the D/A converter 21), the detected output change amount detecting means (the latch circuit 22 and the adder 23), and the control portion 26 can be implemented by the DSP.

Figure 4:
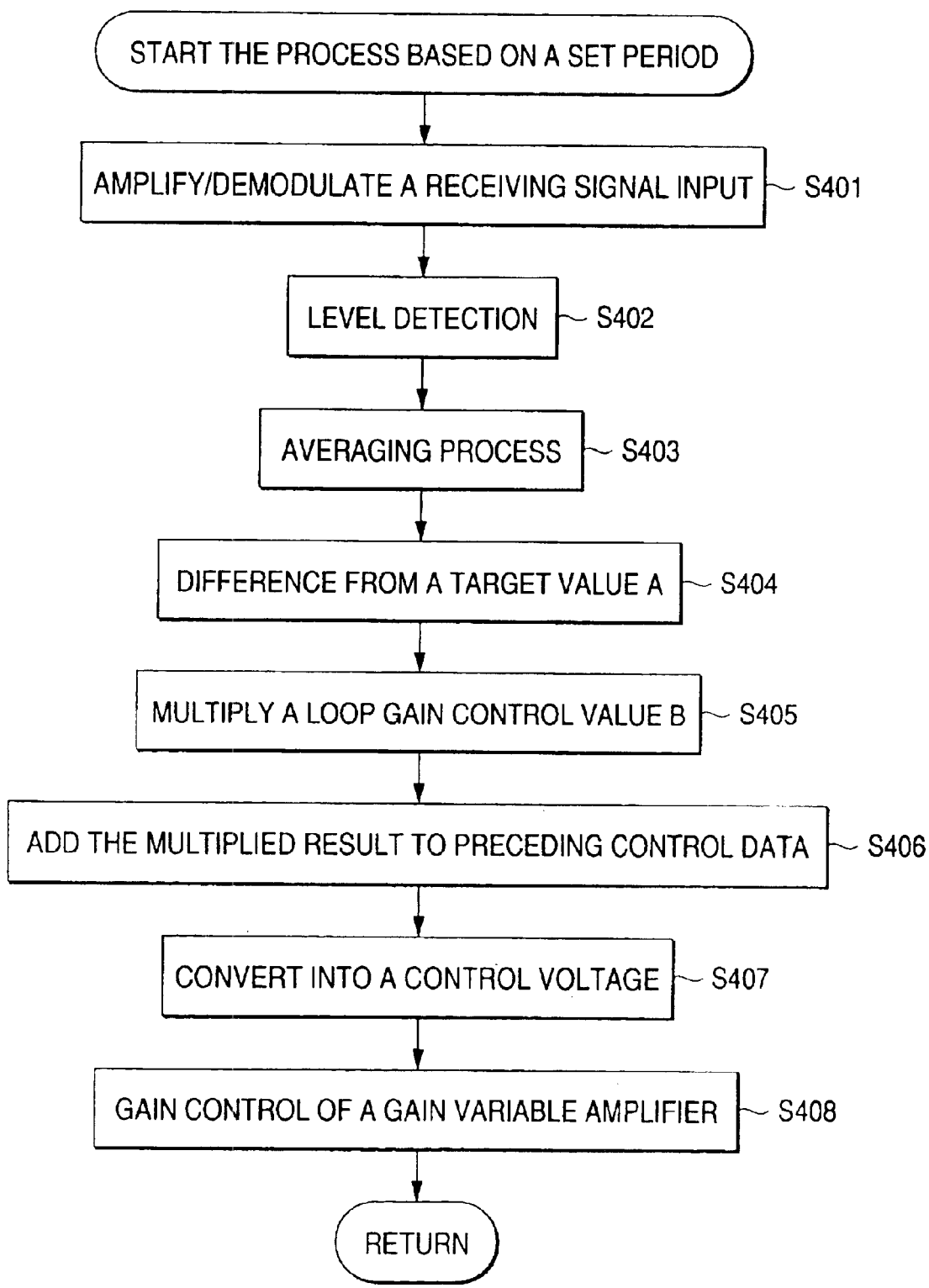
FIG. 4 is a flowchart showing procedures in a software program (automatic gain control method) which is executed on a DSP in a second variation.

Like the first embodiment, the process portions corresponding to the automatic gain control loop (control signal generating step) are executed by the procedures in the flowchart shown in FIG. 4. However, as for the above timing for adding (integrating) the control data in step S406 of FIG. 4, an integration timing of the control signal is set separately by procedures in a flowchart of FIG. 9.

More particularly, FIG. 9 is a flowchart showing a method of deciding an integration period (integration timing) in the third embodiment, which corresponds to the detected output change amount detecting means and the control portion. In step S901, the level detection of the received electric field is carried out. In step S902, the level-detected data are subjected to the averaging process for a predetermined time. Then, in step S903, an amount of change in the detection data is calculated based on the difference from the preceding detection data. In step S904, the integration period (integration timing) of the control data is decided based on the calculated amount of change in the detection data. Where the steps S901 to S903 correspond to a detected output change amount detecting step set forth in claims, and the step S904 corresponds to a control step set forth in claims. In this case, the same steps as the steps S402 and S403 in FIG. 4 may be utilized as the steps S901 and S902.

As described above, according to the automatic gain control circuit of the third embodiment and the first and second variations of the third embodiment, the generation period Tn [s] (or the generation timing) of the control signal GC can be decided in response to an amount of change in the detected output of the demodulated output Rd which is detected by the detected output change amount detecting means (detected output change amount detecting step). Therefore, under various situations such as the case where large variation in the receiving signal level is expected at the time of the turn-ON operation of the power supply, the case where small variation in the receiving signal level is caused because the condition of the electric field is stabilized, or the like, the generation period (or the generation timing) of the control signal for the automatic gain control loop can be optimized finely and the follow-up performance of the automatic gain control loop can be optimized to thus assure the good receiving characteristic.

Fourth Embodiment

Figure 10:
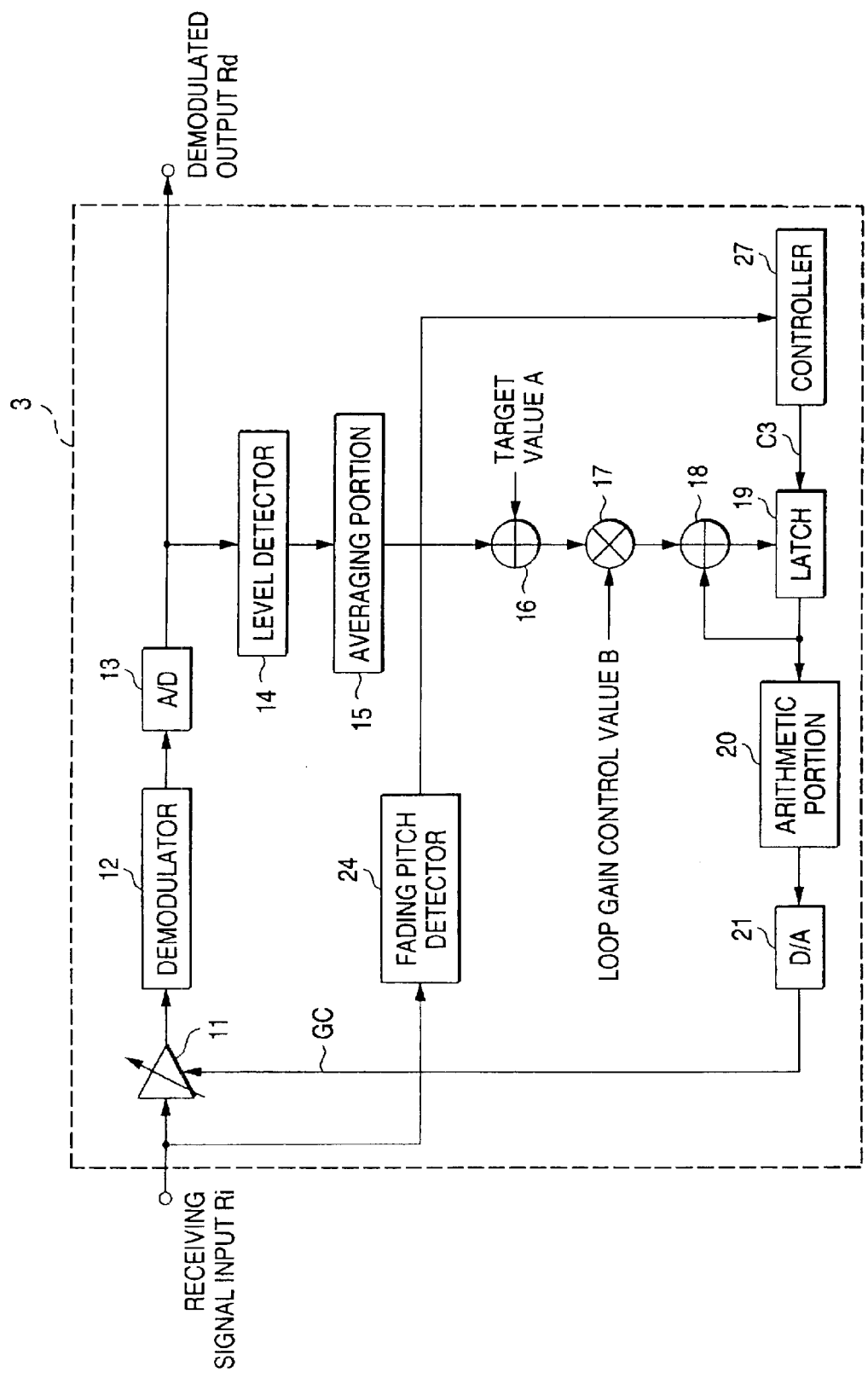
FIG. 10 is a view showing a configuration of an automatic gain control circuit according to a fourth embodiment of the present invention.

FIG. 10 is a view showing a configuration of an automatic gain control circuit according to a fourth embodiment of the present invention, and an automatic gain control method according to the present invention is applied to the automatic gain control circuit. In FIG. 10, like reference symbols are affixed to the same or similar parts as those in FIG. 1 (first embodiment).

In FIG. 10, the automatic gain control circuit according to the fourth embodiment is constructed to comprises the gain variable amplifier 11, the demodulator portion 12, the A/D converter 13, the level detector 14, the averaging portion 15, the difference-in-converged value calculating adder 16, the loop gain controlling multiplier 17, the adder 18 in the integrator circuit portion, the latch circuit 19 in the integrator circuit portion, the arithmetic portion 20, the D/A converter 21, a fading pitch detector portion 24, and a control portion 27.

The gain variable amplifier 11, the demodulator portion 12, and the A/D converter 13 construct a receiver system which receives the receiving signal Ri and then outputs the demodulated output Rd. The level detector 14, the averaging portion 15, the difference-in-converged value calculating adder 16, the loop gain controlling multiplier 17, the adder 18 in the integrator circuit portion, the latch circuit 19 in the integrator circuit portion, the arithmetic portion 20, and the D/A converter 21 construct the automatic gain control loop. In this case, the automatic gain control loop corresponds to a control signal generating means set forth in claims. Also, the control portion 27 can be implemented by the processing means such as the microprocessor, etc., and corresponds to the controlling means set forth in claims. In addition, the fading pitch detector portion 24 corresponds to a means for detecting a fading pitch of the receiving signal Ri set forth in claims.

Since configurations of the receiver system and the automatic gain control loop according to the fourth embodiment are identical to those in the first embodiment, their functional explanation and their operational explanation will be omitted. In other words, the circuit configuration of the automatic gain control circuit according to the fourth embodiment can be implemented by adding the fading pitch detector portion 24 to the configuration of the first embodiment (FIG. 1), and is characterized by an approach for deciding the generation timing or the generation period of the control signal GC in the control portion 27.

In FIG. 10, like the first embodiment, the control portion 27 outputs the latch timing control signal C3 to control the timing at which an output of the adder 18 is latched by the latch circuit 19 in the integrator circuit portion. The preceding loop gain data in the automatic gain control loop are held in the latch circuit 19, and the result which is obtained by adding an amount of change in the loop gain data by the adder 18 is latched by the trigger of the latch timing control signal C3. Therefore, the latch timing control signal C3 can define the generation timing of the control signal GC, and the trigger period of the latch timing control signal C3 coincides with the generation period of the control signal GC.

In accordance with the fading pitch of the receiving signal Ri detected by the fading pitch detector portion 24, the control portion 27 decides the generation period (generation timing) of the control signal GC. In more detail, the control portion 27 sets the optimum generation period of the control signal GC in response to the fading pitch, and then outputs the trigger of the latch timing control signal C3 to the latch circuit 19 in the integrator circuit portion based on such generation period.

The integrator circuit portion integrates an amount of change in the loop gain data by updating the data in the latch circuit 19 by the trigger of the latch timing control signal C3. Further, the integral data integrated by the integrator circuit portion are converted into data which are equivalent to the control voltage for the gain variable amplifier 11 by the arithmetic portion 20. Then, the arithmetic result is converted into an analogue voltage by the D/A converter 21, and then fed back to the gain variable amplifier 11 as the control voltage based on the data.

Next, as a first variation of the automatic gain control circuit according to the fourth embodiment, a variation in which a numerical value translation table (look-up table) is employed in the control portion 27 will be explained hereunder. In this case, the control portion 27 is constructed, for example, by incorporating a memory such as the ROM, etc., in which the numerical value translation table is stored, into the microprocessor. The memory holds the generation period of the control signal GC in answer to the fading pitch of the receiving signal Ri. The memory receives an output of the fading pitch detector portion 24, and then supplies the generation period of the control signal GC to the microprocessor. Then, the microprocessor generates the trigger of the latch timing control signal C3 based on the generation period of the control signal GC. If such numerical value translation table (look-up table) is employed, update of the generation period data of the control signal GC can be conducted simply by exchanging the ROM, etc.

Next, as a second variation of the automatic gain control circuit according to the fourth embodiment, a variation in which the digital signal processor (DSP) is employed in the automatic gain control loop will be explained hereunder. In this case, for example, configurations of the automatic gain control loop (the level detector 14, the averaging portion 15, the difference-in-converged value calculating adder 16, the loop gain controlling multiplier 17, the adder 18 in an integrator circuit portion, the latch circuit 19 in an integrator circuit portion, the arithmetic portion 20, and the D/A converter 21), the fading pitch detector portion 24 and the control portion 27 shown in FIG. 10 can be implemented by the DSP.

Like the first embodiment, the process portions corresponding to the automatic gain control loop (control signal generating step) are executed by the procedures in the flowchart shown in FIG. 4. However, as for the above timing for adding (integrating) the control data in step S406 of FIG. 4, the integration timing of the control signal is set separately by procedures in a flowchart shown in FIG. 11.

Figure 11:
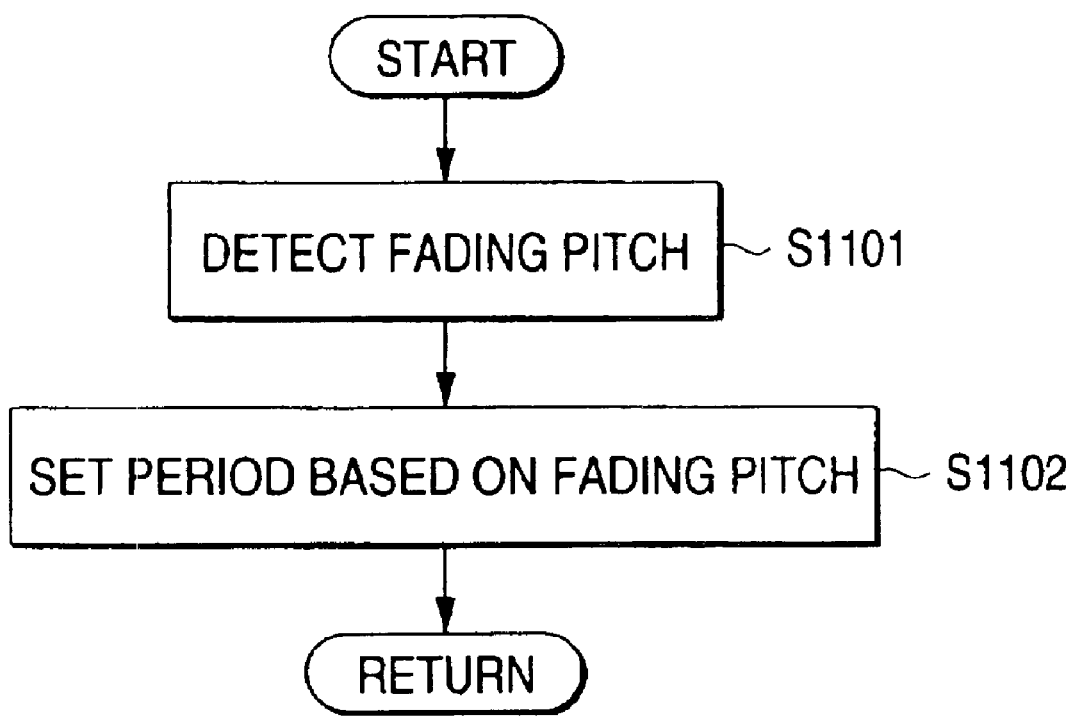
FIG. 11 is a flowchart showing a method of deciding an integration period (integration timing) in the fourth embodiment.

More particularly, FIG. 11 is a flowchart showing a method of deciding the integration period (integration timing) in the fourth embodiment, which corresponds to the fading pitch detector portion and the control portion. In step S1101, a fading pitch of the receiving signal Ri is detected. In step S1102, integration period (integration timing) of the control data is decided based on the detected fading pitch. Where the step S1001 corresponds to a fading pitch detecting step set forth in claims, and the step S1002 corresponds to a controlling step set forth in claims.

As described above, according to the automatic gain control circuit of the fourth embodiment and the first and second variations of the fourth embodiment, the generation period (or the generation timing) of the control signal can be decided in response to the fading pitch of the receiving signal Ri which is detected by the fading pitch detector portion 24 (fading pitch detecting step). Therefore, even in the case where large variation in the receiving signal level is expected in receiving the receiving signal in the fading circumstance, etc., or the case where small variation in the receiving signal level is caused because the condition of the electric field is stabilized, the generation period (the generation timing) of the control signal for the automatic gain control loop can be optimized and the follow-up performance of the automatic gain control loop can be optimized to thus assure the good receiving characteristic.

Fifth Embodiment

Figure 12:
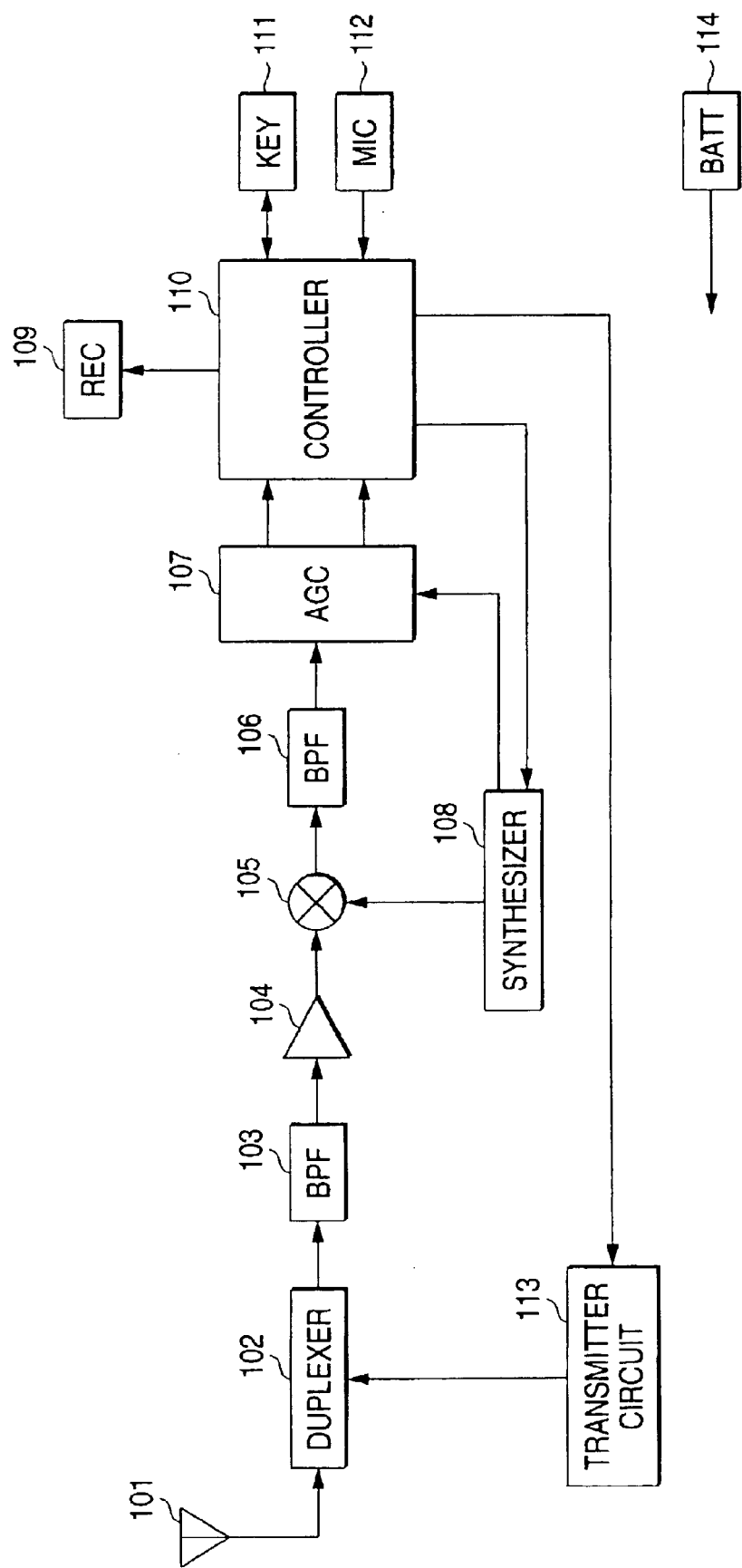
FIG. 12 is a view showing a configuration of a receiver device including an automatic gain control circuit according to a fifth embodiment of the present invention.

FIG. 12 is a view showing a configuration of a receiver device including an automatic gain control circuit according to a fifth embodiment of the present invention. In the receiver device according to the fifth embodiment, the automatic gain control circuit mentioned in the first, second, third, or fourth embodiment is incorporated as the automatic gain control circuit (AGC).

In FIG. 12, the receiver device according to the fifth embodiment is constructed to comprise an antenna 101 used for transmitting and receiving the signal, an antenna duplexer 102, a high frequency bandpass filter 103, a low noise amplifier 104, a down mixer 105 for executing frequency conversion from the high frequency band to the intermediate frequency band, an intermediate frequency bandpass filter 106, the automatic gain control circuit (AGC) 107, a frequency synthesizer 108, a receiver 109, a key-operated input portion 111 for instructing an operation of the receiver device, a microphone 112, a transmitter circuit 113, a power supply portion 114, and a control portion 110 for handling the control of the receiver device.

An operation of the receiver device according to the fifth embodiment will be explained with reference to FIG; 12 hereunder. First, the signal (for example, the signal in the 2 [GHz] band is assumed herein) is received via the antenna 10. The signal input via the antenna 10 is then passed through the duplexer 102, and then signal components other than the desired frequency band are attenuated by the high frequency bandpass filter 103. After passed through the bandpass filter 103, the signal is amplified by the low noise amplifier 104, then the frequency of the signal is converted into the intermediate frequency band (e.g., 380 [MHz]) by the down mixer 105, and then the signal is input into the automatic gain control circuit 107 via the intermediate frequency bandpass filter 106.

The signal input into the automatic gain control circuit 107 is demodulated by the demodulator circuit 12 provided in the automatic gain control circuit 107, and then output to the control portion 110 as a base band signal to be subjected to the signal processing. In the automatic gain control loop in the automatic gain control circuit 107, the demodulated output Rd is level-detected by the level detector 14 and then is subjected subsequently to the signal processing, described in the first, second, third, or fourth embodiment, whereby the feedback voltage (control signal GC) to be supplied to the gain variable amplifier 11 can be generated.

As described above, according to the receiver device of the fourth embodiment, since the automatic gain control circuit (1, 2, or 3) according to the first, second, third or fourth embodiment is employed, the generation period of the control signal GC for the automatic gain control loop can be set in response to the lapsed time from the non-operated state of the receiving device, an amount of change in the detected output of the receiving signal, or the fading pitch of the receiving signal, etc., under various situations such as the case where large variation in a receiving signal level is expected at the time of a turn-ON operation of a power supply, an intermittent receiving operation of a receiver device, a receiving operation in the fading condition, or the like, or the case where small variation in the receiving signal level is caused because the electric field condition is stabilized. Therefore, the follow-up performance of the automatic gain control loop can be optimized and thus the receiving device can execute the receiving operation as the optimum automatic gain control operation. As a result, the good receiving characteristic can be achieved.

Particularly, if the automatic gain control circuit 1 according to the first embodiments employed, the generation period T2 [s] of the control signal GC can be set shorter than the generation period T1 [s] in the steady operation state, for a predetermined rise period from the non-operated state to the steady operation state when the power supply of the receiver device is shifted from its OFF state to its ON state (when the power supply is turned ON), so as to accelerate the response characteristic of the automatic gain control loop rather than that in the steady operation state, and then such shorter generation period can be switched to the generation period in the steady operation state after the predetermined time T3 [s]. Therefore, the follow-up performance of the automatic gain control loop and the pull-in of the automatic gain control loop can be improved. Even in the case where large variation in the receiving signal level is expected at the time of the turn-ON operation of the power supply, or the case where small variation in the receiving signal level is caused because the condition of the electric field is stabilized, the generation timing or the generation period of the control signal for the automatic gain control loop can be optimized and also the follow-up performance of the automatic gain control loop can be optimized. As a result, the good receiving characteristic can be achieved.

Particularly, if the automatic gain control circuit 1 according to the second embodiments employed, the generation period T5 [s] of the control signal GC can be set shorter than the generation period T4 [s] in the steady operation state, for a predetermined rise period from the non-operated state to the steady operation state when the receiver device carries out the intermittent receiving operation, so as to accelerate the response characteristic of the automatic gain control loop rather than that in the steady operation state, and then such shorter generation period can be switched to the generation period in the steady operation state after the predetermined time T6 [s]. Therefore, the follow-up performance of the automatic gain control loop and the pull-in of the automatic gain control loop can be improved. Even in the case where large variation in the receiving signal level is expected at the time of the intermittent receiving operation of the receiver device, or the case where small variation in the receiving signal level is caused because the condition of the electric field is stabilized, the generation timing or the generation period of the control signal for the automatic gain control loop can be optimized and also the follow-up performance of the automatic gain control loop can be optimized. As a result, the good receiving characteristic can be achieved.

As described above, according to the automatic gain control circuit and the receiver device with such automatic gain control circuit, the automatic gain control method in the receiver device, and the recording medium of the present invention, when the control signal for the gain variable amplifier is generated by level-detecting the receiving signal and generating the feedback signal by the control signal generating means (control signal generating step), the generation timing or the generation period of the control signal is decided in response to a predetermined physical quantity by the controlling means (controlling step). Therefore, under various situations such as the case where large variation in a receiving signal level is expected, the case where small variation in the receiving signal level is caused because the electric field condition is stabilized, or the like, the generation timing or the generation period of the control signal for the automatic gain control loop can be decided by setting the physical quantity to respond to various conditions. As a result, the follow-up performance of the automatic gain control loop can be optimized under various situations, and thus the good receiving characteristic can be achieved.

Also, according to the present invention, the generation timing or the generation period of the control signal for the automatic gain control amplifier can be decided in response to the predetermined physical quantity by selecting the predetermined physical quantity as address information and then referring to the look-up table in which information of the generation timing or the generation period of the control signal are held to correspond to the address information. Therefore, under various situations such as the case where large variation in the receiving signal level is expected at the time of the turn-ON operation of the power supply, the intermittent receiving operation of the receiver device, the receiving operation in the fading condition, or the like, or the case where small variation in the receiving signal level is caused because the electric field condition is stabilized, the predetermined physical quantity can be set finely by referring to the look-up table upon optimization of the generation timing or the generation period of the control signal for the automatic gain control loop. Hence, the follow-up performance of the automatic gain control loop can be optimized under various conditions, and thus the good receiving characteristic can be achieved. Also, the method of generating the generation timing or the generation period of the control signal and also the data stored in the table can be changed simply by exchanging the look-up table.

Also, according to the present invention, the generation timing or the generation period of the control signal can be decided by the controlling means (controlling step) in response to the lapsed time in operation of the automatic gain control circuit or the receiving device which is constructed to comprise the automatic gain control circuit. For a predetermined rise period from the non-operated state to the steady operation state when the power supply is turned ON, the generation period of the control signal can be set shorter than the generation period in the steady operation state so as to accelerate the response characteristic of the automatic gain control loop rather than that in the steady operation state. Therefore, even in the case where large variation in the receiving signal level is expected at the time of the power supply ON, the generation timing or the generation period of the control signal for the automatic gain control loop can be optimized and also the follow-up performance of the automatic gain control loop can be optimized to thus assure the good receiving characteristic.

Also, according to the present invention, the generation timing or the generation period of the control signal can be decided by the controlling means (controlling step) in response to the lapsed time in operation of the automatic gain control circuit or the receiving device which is constructed to comprise the automatic gain control circuit. For a predetermined rise period from the non-operated state to the steady operation state when the receiver device carries out the intermittent receiving operation, the generation period of the control signal can be set shorter than the generation period in the steady operation state so as to accelerate the response characteristic of the automatic gain control loop rather than that in the steady operation state. Therefore, even in the case where large variation in the receiving signal level is expected at the time of the intermittent receiving operation of the receiver device, the generation timing or the generation period of the control signal for the automatic gain control loop can be optimized and also the follow-up performance of the automatic gain control loop can be optimized to thus assure the good receiving characteristic.

Also, according to the present invention, the generation timing or the generation period of the control signal GC can be decided in response to an amount of change in the detected output of the demodulated output which is detected by the detected output change amount detecting means (detected output change amount detecting step). Therefore, under various situations such as the case where large variation in the receiving signal level is expected, the case where small variation in the receiving signal level is caused because the condition of the electric field is stabilized, or the like, the generation timing or the generation period of the control signal for the automatic gain control loop can be optimized finely and the follow-up performance of the automatic gain control loop can be optimized to thus assure the good receiving characteristic.

Furthermore, according to the present invention, the generation timing or the generation period of the control signal can be decided by the controlling means (controlling step) in response to the fading pitch of the receiving signal which is detected by the fading pitch detector portion (fading pitch detecting step). Therefore, even in the case where large variation in the receiving signal level is expected in receiving the receiving signal in the fading circumstance, etc., or the case where small variation in the receiving signal level is caused because the condition of the electric field is stabilized, the generation timing or the generation period of the control signal for the automatic gain control loop can be optimized and the follow-up performance of the automatic gain control loop can be optimized to thus assure the good receiving characteristic.

What is claimed is:

1. An automatic gain control circuit comprising:

a gain variable amplifier which controls an amplitude of a receiving signal based on a control signal;

control signal generating means for level-detecting the receiving signal, averaging the detected receiving signal level for a predetermined time, and then generating a feedback signal as the control signal for the gain variable amplifier; and controlling means for deciding at least one of a generation timing of the control signal and a generation period of the control signal in response to a predetermined physical quantity, and controlling the control signal generating means, wherein the controlling means decides the generation timing of the control signal or the generation period of the control signal using a lapsed time in operation of the automatic gain control circuit as the predetermined physical quantity.

2. An automatic gain control method in a receiver device including a gain variable amplifier which controls an amplitude of a receiving signal based on a control signal, the method comprising:

a control signal generating step of level-detecting the receiving signal, averaging the detected receiving signal over a predetermined period of time, and then generating a feedback signal as the control signal for the gain variable amplifier; and a controlling step of deciding a generation timing of the control signal or a generation period of the control signal in response to a predetermined physical quantity, wherein the controlling step decides the generation timing of the control signal or the generation period of the control signal using a lapsed time in operation of the receiver device as the predetermined physical quantity.

3. An automatic gain control circuit comprising:

a gain variable amplifier which controls an amplitude of a receiving signal based on a control signal;

control signal generating means for level-detecting the receiving signal and then generating a feedback signal as the control signal for the gain variable amplifier; and controlling means for deciding at least one of a generation timing of the control signal and a generation period of the control signal in response to a predetermined physical quantity, and controlling the control signal generating means, wherein the controlling means decides the generation timing of the control signal or the generation period of the control signal using a lapsed time in operation of the automatic gain control circuit as the predetermined physical quantity.

4. An automatic gain control method in a receiver device including a gain variable amplifier which controls an amplitude of a receiving signal based on a control signal, the method comprising:

a control signal generating step of level-detecting the receiving signal and then generating a feedback signal as the control signal for the gain variable amplifier; and a controlling step of deciding a generation timing of the control signal or a generation period of the control signal in response to a predetermined physical quantity, wherein the controlling step decides the generation timing of the control signal or the generation period of the control signal using a lapsed time in operation of the receiver device as the predetermined physical quantity.

* * * * *